(12) United States Patent
Kitagawa et al.

(10) Patent No.: US 8,866,022 B2
(45) Date of Patent: Oct. 21, 2014

(54) PRINTED WIRING BOARD, BUILD-UP MULTI-LAYER BOARD, AND PRODUCTION METHOD THEREFOR

(75) Inventors: Yoshito Kitagawa, Osaka (JP); Naoyuki Tani, Osaka (JP); Toshiyuki Asahi, Osaka (JP)

(73) Assignee: Panasonic Corporation, Osaka (JP)

(*) Notice: Subject to any disclaimer, the term of this patent is extended or adjusted under 35 U.S.C. 154(b) by 341 days.

(21) Appl. No.: 13/392,554

(22) PCT Filed: Sep. 2, 2010

(86) PCT No.: PCT/JP2010/005402
§ 371 (c)(1),
(2), (4) Date: Feb. 27, 2012

(87) PCT Pub. No.: WO2011/027558
PCT Pub. Date: Mar. 10, 2011

(65) Prior Publication Data
US 2012/0152599 A1 Jun. 21, 2012

(30) Foreign Application Priority Data

Sep. 2, 2009 (JP) ................................. 2009-202202
Jan. 20, 2010 (JP) ................................. 2010-009771

(51) Int. Cl.
H05K 1/00 (2006.01)
H05K 3/00 (2006.01)
H05K 3/38 (2006.01)
H05K 3/46 (2006.01)

(52) U.S. Cl.
CPC .............. H05K 3/381 (2013.01); H05K 3/4644 (2013.01); H05K 2201/2072 (2013.01); H05K 2201/0209 (2013.01); H05K 3/4652 (2013.01); H05K 2203/0773 (2013.01)
USPC .............. 174/258; 174/257; 361/750; 29/831

(58) Field of Classification Search
CPC ... H05K 1/141; H05K 1/0306; H05K 1/0271; H05K 3/3447; H05K 3/381; H05K 3/4644; H05K 3/4652; H05K 2201/0209; H05K 2201/2072; H05K 2203/0773; H05K 2201/0355

USPC ............ 174/255–258; 361/748–751; 29/830, 29/831, 842, 846, 847, 849
See application file for complete search history.

(56) References Cited

U.S. PATENT DOCUMENTS 6,124,023 A 9/2000 Furuta et al.
6,534,723 B1 3/2003 Asai et al.
(Continued)

FOREIGN PATENT DOCUMENTS

JP 01-206696 8/1989
JP 05-299814 11/1993
(Continued)

OTHER PUBLICATIONS

International Search Report of PCT Application No. PCT/JP2010/005402, dated Dec. 7, 2010.
(Continued)

Primary Examiner — Hoa C Nguyen
(74) Attorney, Agent, or Firm — Panasonic Patent Center

(57) ABSTRACT

A multi-layer printed-wiring-board is used in densely packaging electronic components such as semiconductors having improved function, and a production method therefor, and more specifically it achieves a multi-layer printed-wiring-board having excellent copper-foil-peel-strength and high connection-reliability in which occurrence of structural defects such as delamination (interlayer peeling) is prevented, and a production method therefor. Because of thinning of the printed-wiring-board or diversification of insulating layers constituting the printed-wiring-board, peeling such as delamination may occur between the insulating layers or in an interface between the insulating layer and the plated conductor. By providing pores in substantially the same plane as wiring patterns in the printed-wiring-board including insulating layers, wiring pattern layers made of copper foil alternately laminated on the insulating layers, and pores provided between the wiring patterns, a printed-wiring-board having high connection reliability free from delamination or cracks during heating or in heat cycle conditions.

16 Claims, 20 Drawing Sheets

(56) References Cited

U.S. PATENT DOCUMENTS

| | | | |
|---|---|---|---|
| 6,560,863 B2 * | 5/2003 | Koyama et al. | 29/846 |
| 6,855,892 B2 * | 2/2005 | Komatsu et al. | 174/256 |
| 7,390,974 B2 * | 6/2008 | Shirai et al. | 174/263 |
| 2004/0151884 A1 | 8/2004 | Higashitani | |
| 2005/0202261 A1 | 9/2005 | Takai et al. | |

FOREIGN PATENT DOCUMENTS

| | | |
|---|---|---|
| JP | 06-204660 | 7/1994 |
| JP | 07-162147 | 6/1995 |
| JP | 08-181438 | 7/1996 |
| JP | 09-232757 | 9/1997 |
| JP | 10-212364 | 8/1998 |
| JP | 2000-191910 | 7/2000 |
| JP | 2001-217549 | 8/2001 |
| JP | 2004-146711 | 5/2004 |
| JP | 2005-285862 | 10/2005 |

OTHER PUBLICATIONS

The Extended European Search Report dated Jul. 18, 2014 for the related European Patent Application No. 10813509.6.

* cited by examiner

PRINTED WIRING BOARD, BUILD-UP MULTI-LAYER BOARD, AND PRODUCTION METHOD THEREFOR

TECHNICAL FIELD

The present invention relates to a multi-layer printed wiring board which is used when various electronic components such as semiconductors having improved function are densely packaged, and which has an excellent copper foil peel strength and high connection reliability in which occurrence of structural defects such as delamination (delamination is also referred to as interlayer peeling) is prevented, and to a production method therefor.

BACKGROUND ART

Conventionally, as a printed wiring board on which electronic components are to be packaged, a printed wiring board obtained by laminating a plurality of prepregs including a glass-epoxy resin and members including copper foil on each other, integrating and hardening thereof has been used. With miniaturization and improvement of performance of devices, electronic components such as semiconductors are required to be densely packaged. Thus, there is a demand for thinning of an insulating layer according to miniaturization and for high connection reliability of a through hole or a via hole suitable for high-density wiring.

One example of a problem about delamination is described. Since delamination may cause swelling during reflow, a method of subjecting wiring used for an inner layer to chemical treatment or physical polishing so as to increase the surface roughness, thereby enhancing adhesion between the wiring on the inner layer and the insulating layer is carried out.

In order to form highly precise wiring and, at the same time, to enhance copper foil peel strength, a method for increasing the roughness of a resin surface by dissolving the resin with, for example, an alkaline solution before an electroless plating process, followed by forming a plated conductor, thus enhancing the anchoring effect is employed.

Furthermore, in order to enhance the connection reliability, the following method is carried out. A through hole is processed by using a drill, and then desmear treatment prior to electroless plating is carried out to dissolve resin of an insulating layer portion on the inner wall surface of the through hole, thereby enhancing the surface roughness. After that, by enhancing adhesion of electrolytic copper produced on the inner wall surface of the through hole by electroless plating and electrolytic plating processes to the wall surface of the through hole, the anchoring effect between the wall surface of the through hole and the electrolytic copper is enhanced, and the connection reliability in, for example, a thermal-shock test is enhanced.

In a conventional printed wiring board, however, as wiring is being made to be finer so that it corresponds to high-density wiring, it is necessary to improve adhesion between the wiring and the insulating layer and between a resist and the insulating layer for fine patterning. Furthermore, the amount of resin is being reduced because of thinning of the insulating layer according to the miniaturization, and as a result, delamination occurs due to shortage of the adhesion force of the inner layer.

Furthermore, steps of soft etching treatment may be complicated. In order to enhance the adhesion between a wiring pattern and an insulating layer, for example, PTL 1 proposes a method of providing excellent adhesion to a wiring board without carrying out soft etching treatment. However, this method may be insufficient to correspond to fine patterning. Furthermore, when a plated conductor is thinned for forming a fine pattern and the density of the wiring is further increased, during heating or in heat cycle conditions, in through holes and via holes, disconnection caused by cracks due to a difference in the thermal expansion coefficients between these members, peeling with respect to the insulating layer and the plated conductor, and the like, occur. As a result, sufficient connection reliability cannot be secured.

CITATION LIST

Patent Literature

PTL 1: Japanese Patent Unexamined Publication No. H6-204660

SUMMARY OF THE INVENTION

The present invention provides a printed wiring board including a plurality of insulating layers; a plurality of layers of wiring patterns made of copper foil, which are alternately laminated on the insulating layers; and a resin-filled layer provided only between the wiring patterns in one layer. The insulating layer includes at least resin, glass woven fabric and/or nonwoven fabric, and inorganic filler whose content is 30 vol. % or more and 70 vol. % or less with respect to the insulating layer. The resin-filled layer includes a plurality of pores and/or a resin product obtained by filling the pores with resin.

Furthermore, the present invention provides a printed wiring board including a plurality of insulating layers; a plurality of layers of wiring patterns made of copper foil, which are alternately laminated on the insulating layers; and a through hole including a plated conductor, formed inside a hole, electrically connecting between the wiring pattern layers. The insulating layer includes at least resin, and inorganic filler whose content is 30 vol. % or more and 70 vol. % or less with respect to the insulating layer. A portion of the insulating layer, which surrounds the through hole or the plated conductor, includes any one or more of a plurality of pores and a plurality of protrusions provided at the insulating layer side of the plated conductor.

According to the printed wiring board of the present invention, by laminating a plurality of pores provided between the plurality of insulating layers on the same plane as that of the wiring patterns, occurrence of internal structural defects such as delamination can be suppressed, so that defects such as swelling does not occur during reflow. Furthermore, by providing a plurality of pores on the surface layer, adhesion of the resist, the plated conductor, and the like, can be improved, thus enabling finer wiring. Thus, a multilayer printed wiring board free from structural defects such as delamination can be provided. At the same time, by forming a plurality of pores in the portion surrounding the plated conductor on the insulating layer, or by providing a plurality of protrusions as an anchor at the insulating layer side of the plated conductor, it is possible to provide a multi-layer printed wiring board having excellent connection reliability in which occurrence of cracks due to the difference in the thermal expansion coefficients in the through hole and via hole portions.

DESCRIPTION OF EMBODIMENTS

First Exemplary Embodiment

Figure 1:
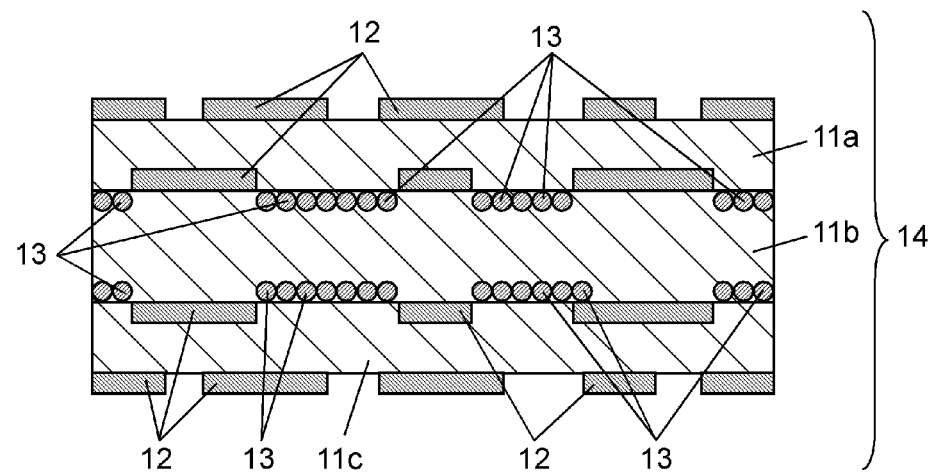
FIG. 1 is a sectional view showing an example of a structure of a printed wiring board in accordance with a first exemplary embodiment of the present invention.

Hereinafter, a printed wiring board in accordance with a first exemplary embodiment of the present invention is described. FIG. 1 is a sectional view showing an example of a structure of the printed wiring board in accordance with the first exemplary embodiment of the present invention.

Insulating layers 11a, 11b, and 11c, wiring patterns 12, pores 13, and printed wiring board 14 are shown in FIG. 1.

Printed wiring board 14 shown in FIG. 1 includes a plurality of insulating layers 11a, 11b, and 11c, a plurality of wiring patterns 12 obtained by etching copper foil into predetermined patterns, and a plurality of pores 13 provided between wiring patterns 12. In FIG. 1, pores 13 are provided in all of the portions between wiring patterns 12, but may be provided in at least a part of the portions between wiring patterns 12.

Insulating layers 11a, 11b and 11c of printed wiring board 14 include at least resin, glass woven fabric and/or nonwoven fabric, inorganic filler (the content of the inorganic filler is desirably 30 vol. % or more and 70 vol. % or less with respect to the insulating layer).

Pores 13 are selectively provided only at insulating layer 11b side (not at insulating layer 11a and 11c sides) on substantially the same plane as that of wiring pattern 12.

In more detail, in FIG. 1, a plurality of pores 13 are provided, for example, only at insulating layer 11b side on the plane on which wiring patterns 12 are not provided (that is to say, the plane on which insulating layer 11b is brought into contact with insulating layer 11a or insulating layer 11c) on both surfaces of insulating layer 11b.

For example, pores 13 provided at the side facing insulating layer 11a of insulating layer 11b are provided not at insulating layer 11a side but at insulating layer 11b side on a portion that does not have wiring patterns 12 that are provided between insulating layer 11a and insulating layer 11b (that is to say, a plane on which insulating layer 11a and insulating layer 11b are brought into contact with each other).

Printed wiring board 14 shown in FIG. 1 is a four-layer product, but when printed wiring board 14 is a six-layer product, an eight-layer product, and the like (these are not shown), pores 13 may be provided on the insulating layer that is substantially the same plane of wiring patterns 12 as the inner layer as shown in FIG. 1.

Pores 13 shown in FIG. 1 are formed as follows. Firstly, as shown in FIG. 1, insulating layer 11b as a core substrate (the core substrate refers to the vicinity of the middle portion of printed wiring board 14) is hardened (for example, resin such as an epoxy resin constituting insulating layer 11b is hardened), and the shape of inorganic filler contained in insulating layer 11b is imprinted in insulating layer 11b. The imprinting is, for example, a technique for carrying out micromachining by pressing an original plate onto the substrate.

Thereafter, inorganic fillers, which are expressed on insulating layer 11b exposed to spaces between wiring patterns 12 provided on the surface of insulating layer 11b as the core substrate, are removed with, for example, acids so as to form pores. Thus, pores 13 having a shape similar to that of the inorganic filler are produced. After that, insulating layers 11a and 11b are formed thereon as shown in FIG. 1.

In FIG. 1, the glass woven fabric (it may be glass woven fabric or glass nonwoven fabric, or both or either thereof) and the inorganic filler incorporated in insulating layers 11a, 11b and 11c are not shown.

In FIG. 1, when a plurality of pores 13 are formed at random in a form of a layer, an effect of enhancing the connection strength among insulating layers 11a, 11b and 11c can be obtained.

Insulating layers 11a, 11b and 11c may be formed of the same material (for example, the same prepreg). In this case, as shown in FIG. 1, in pores 13 (for example, pores 13 formed by thermally hardening resin materials constituting insulating layer 11b) formed on the interfaces between insulating layer 11b as a core portion (or a core material) and insulating layers 11a and 11c, a part of resin materials (that is to say, semi-hardened resin constituting a prepreg) constituting insulating layers 11a and 11c is filled and hardened. Thereby, an adhesion force between the layers can be further enhanced.

In this way, with the configuration shows in FIG. 1, the adhesion force between the layers can be further enhanced even if the same resin materials are used. This is because a plurality of pores 13, into which a part of insulating layer 11a and insulating layer 11b laminated on insulating layer 11b can be filled, are provided on the surface of insulating layer 11b in a state in which the resin materials constituting insulating layer 11b are hardened.

Note here that different resin materials (for example, a first resin and a second resin) and insulating materials may be used for insulating layers 11a, 11b and 11c. In this case, as shown in FIG. 1, in pores 13 (for example, pores 13 formed by thermally hardening the second resin constituting insulating layer 11b) formed on the interfaces between insulating layer 11b as a core portion (or a core material) and insulating layers 11a and 11c, a part of the first resin constituting insulating layers 11a and 11c (that is to say, the first resin, semi-hardened resin which constitutes insulating layers 11a and 11c and which is different from the second resin constituting insulating layer 11b) is filled and hardened. Thereby, the adhesion force between the layers can be enhanced. In this way, with the configuration shown in FIG. 1, the adhesion force between layers can be enhanced even when different resin materials (for example, the first resin and the second resin) are used.

Note here that when pores 13 are intact (that is to say, in a state in which pores contain nothing or are filled with air and the like), an effect of absorbing a stress generated due to the difference in the thermal expansion coefficients of insulating layers 11a, 11b and 11c when a thermal-shock test and the like is carried out.

Furthermore, when pores 13 are used (for example, pores 13 provided on at least one surface of insulating layer 11b are filled with a part of the resin materials constituting adjacent insulating layers 11a and 11c), bonding strength between insulating layers 11a, 11b and 11c can be enhanced, and thus an effect of suppressing delamination can be achieved.

When the density of pores 13 shown in FIG. 1 is high, an aggregate of pores 13 may be formed. It is useful that the aggregate of pores 13 is filled with other resin of the other adjacent insulating layers to form resin-filled layer 15 as shown in FIG. 2.

Figure 2:
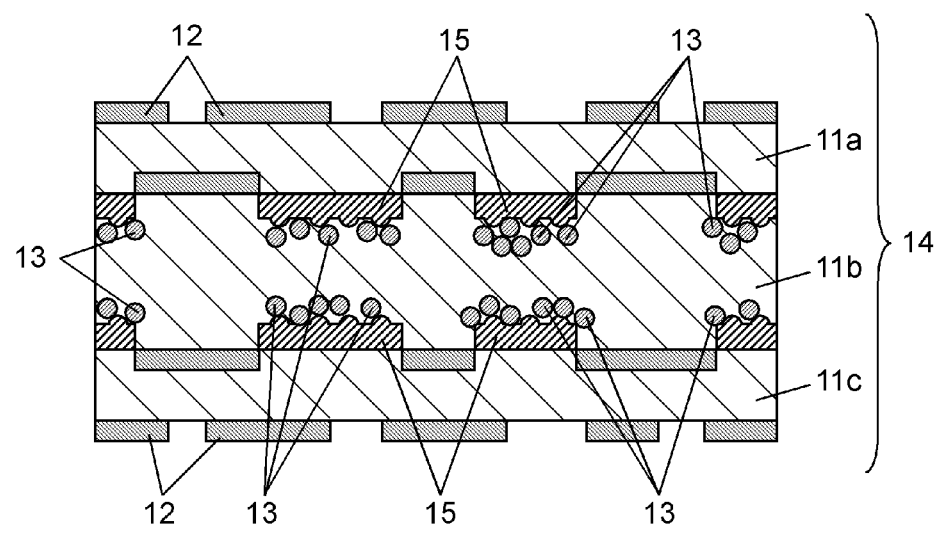
FIG. 2 is a sectional view showing an example of a structure of a printed wiring board having a resin-filled layer inside thereof.

FIG. 2 is a sectional view showing an example of a structure of a printed wiring board having resin-filled layer 15 inside thereof.

Resin-filled layer 15 is shown in FIG. 2. Resin-filled layer 15 is a layered portion including a plurality of pores 13 and/or a resin product formed by filling resin materials constituting the adjacent insulating layer into pores 13.

In more detail, resin-filled layer 15 in FIG. 2 is formed by filling resin materials constituting adjacent insulating layers 11a and 11c into pores 13 that are densely provided at insulating layer 11b side in a region not provided with wiring patterns 12 on the interfaces between insulating layer 11b and insulating layers 11a and 11c, and hardening the resin materials.

As shown in FIG. 2, by filling a plurality of pores 13 formed on at least one surface of insulating layer 11b with resin materials constituting the adjacent insulating layers 11a and 11c (the resin materials may be the same as or different from those of insulating layer 11b) and hardening thereof as resin-filled layer 15, the connection strength among insulating layers 11a, 11b and 11c can be enhanced. Furthermore, pores 13 may be intact (that is to say, in a state in which pores contain nothing or are filled with air and the like).

Figure 3:
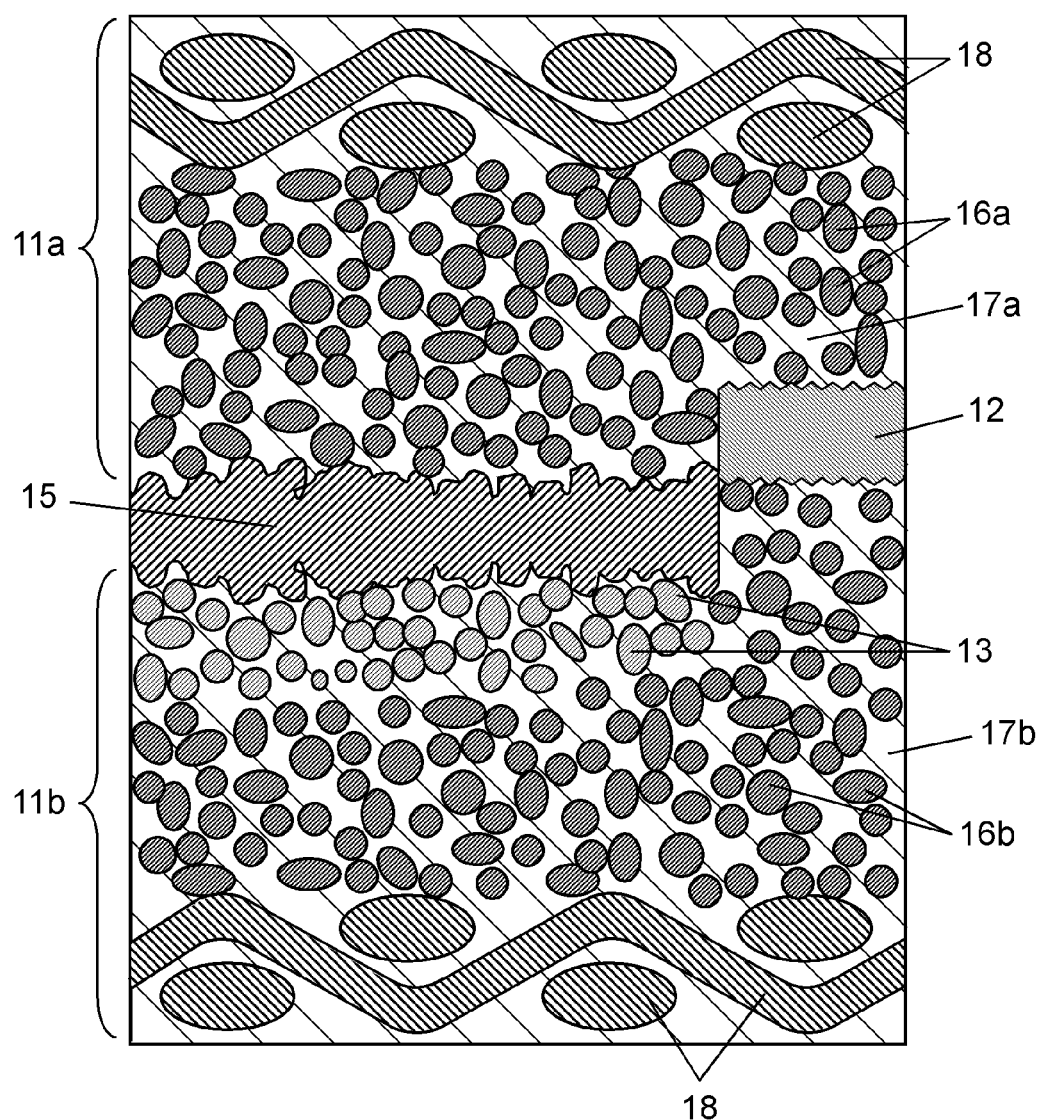
FIG. 3 is an enlarged sectional view of a main part schematically showing a structure of the vicinity of the resin-filled layer.

FIG. 3 is an enlarged sectional view of a main part schematically showing a structure of the vicinity of resin-filled layer 15 shown in FIG. 2. Inorganic filler 16a and 16b, resin 17a and 17b, and glass woven fabric and/or nonwoven fabric 18 are shown in FIG. 3.

As shown in FIG. 3, one end of wiring pattern 12 is formed on substantially the same plane as that of resin-filled layer 15, and one end of wiring pattern 12 and one end of resin-filled layer 15 are brought into contact with each other.

Furthermore, insulating layer 11a and insulating layer 11b adhere to each other and are laminated to be fixed by way of wiring patterns 12 and resin-filled layers 15 provided at the interface between insulating layers 11a and 11b in a form of a sheet (or in a form of a surface).

In FIG. 3, resin-filled layers 15 and pores 13 are formed of resin 17b constituting insulating layer 11b at insulating layer 11b side. In at least a part of resin-filled layers 15 and pores 13, resin 17a constituting insulating layer 11a is filled and hardened. Pore 13 can be also formed by etching inorganic filler 16b.

Herein, glass woven fabric and/or nonwoven fabric 18 may be any one of glass woven fabric and glass nonwoven fabric, or may be a combination of glass woven fabric and glass nonwoven fabric. When glass woven fabric and/or nonwoven fabric 18 is used in this way, the strength of the printed wiring board can be enhanced.

Inorganic filler 16a and 16b and glass woven fabric and/or nonwoven fabric 18 are mutually held by resin 17a and 17b (a thermosetting resin such as an epoxy resin).

Resin-filled layer 15 shown in FIG. 3 includes a portion having a content of inorganic filler 16b of 10 vol. % or less with respect to the whole insulating layer 11b in which resin-filled layer 15 is formed. Furthermore, the portion having the content of inorganic filler 16b of 10 vol. % or less (that is to say, a portion having high rate of resin) may be employed as resin-filled layer 15. Note here that it is not necessary to distinguish resin-filled layer 15 and pore 13 filled with resin from each other.

As shown in FIGS. 2 and 3, by forming pores 13 only on one surface of resin-filled layer 15 (that is to say, only at the insulating layer 11b side), the matching property of resin-filled layer 15 and insulating layer 11b can be enhanced.

In FIG. 3, insulating layers 11a and 11b are formed of glass woven fabric and/or nonwoven fabric 18, inorganic filler 16a and 16b, and resin 17a and 17b.

As shown in FIG. 3, insulating layers 11a and 11b are bonded to each other by way of concavity and convexity provided on the surface of wiring pattern 12 and resin-filled layer 15. Resin layers 11a and 11b are fixed to each other with high strength by an anchoring effect of the concavity and convexity of wiring pattern 12 or by resin-filled layer 15.

As shown in FIG. 3, a plurality of pores 13 are allowed to remain in a form of a layer in resin-filled layer 15 and between insulating layers 11a and 11b, and thereby pores 13 may serve as a kind of buffer layer (or a buffering layer). It is possible to obtain an effect of reducing a stress due to the difference of the thermal expansion coefficients between resin-filled layer 15 and insulating layers 11a and 11b, generated when a thermal-shock test and the like is carried out.

Next, a diameter of pore 13 is described. It is desirable that a diameter of pore 13 is 0.5 times or more and 5.0 times or less as large as the diameter (furthermore, an average particle diameter) of inorganic filler 16b. When the diameter of pore 13 is less than 0.5 times as large as the diameter of the inorganic filler, an advantageous effect by pore 13 may be lowered. Furthermore, the diameter of pore 13 of more than 5.0 times as large as the diameter of inorganic filler 16b may affect thinning of printed wiring board 14. The reason why the diameter of pore 13 is allowed to have a range is because it depends on the particle size distribution of inorganic filler 16b.

Various application examples of pores 13 are described. For example, pores 13 may be allowed to remain as a space (for example, pores 13 may be filled with air and the like), but at least a part of pores 13 may be used to form resin-filled layer 15 shown in FIG. 3. For example, since in a region of insulating layer 11 in which a plurality of pores 13 are formed, as the content of inorganic filler 16b is smaller (that is to say, the content of resin 17b is larger), accordingly resin-filled layer 15 can be easily formed.

When pores 13 are eliminated (or pores 13 are used to form resin-filled layer 15) in this way, an adhesive bonding force between insulating layer 11a and insulating layer 11b can be enhanced by the anchoring effect, and therefore the strength of printed wiring board 14 can be enhanced or the interlayer peeling can be prevented.

As shown in FIG. 3, in resin-filled layer 15, as the content of glass woven fabric and/or nonwoven fabric 18 or inorganic filler 16b is smaller, the rate of resin 17b is accordingly higher as compared with the other parts (for example, insulating layers 11a and 11b in the vicinity of glass woven fabric and/or nonwoven fabric 18, and insulating layers 11a and 11b filled with inorganic filler 16a and 16b). With resin-filled layer 15, insulating layers 11a and 11b can be joined with each other.

Next, in order to achieve the configuration of FIG. 3, a sample experimentally produced by the present inventors is described with reference to FIG. 4.

Figure 4:
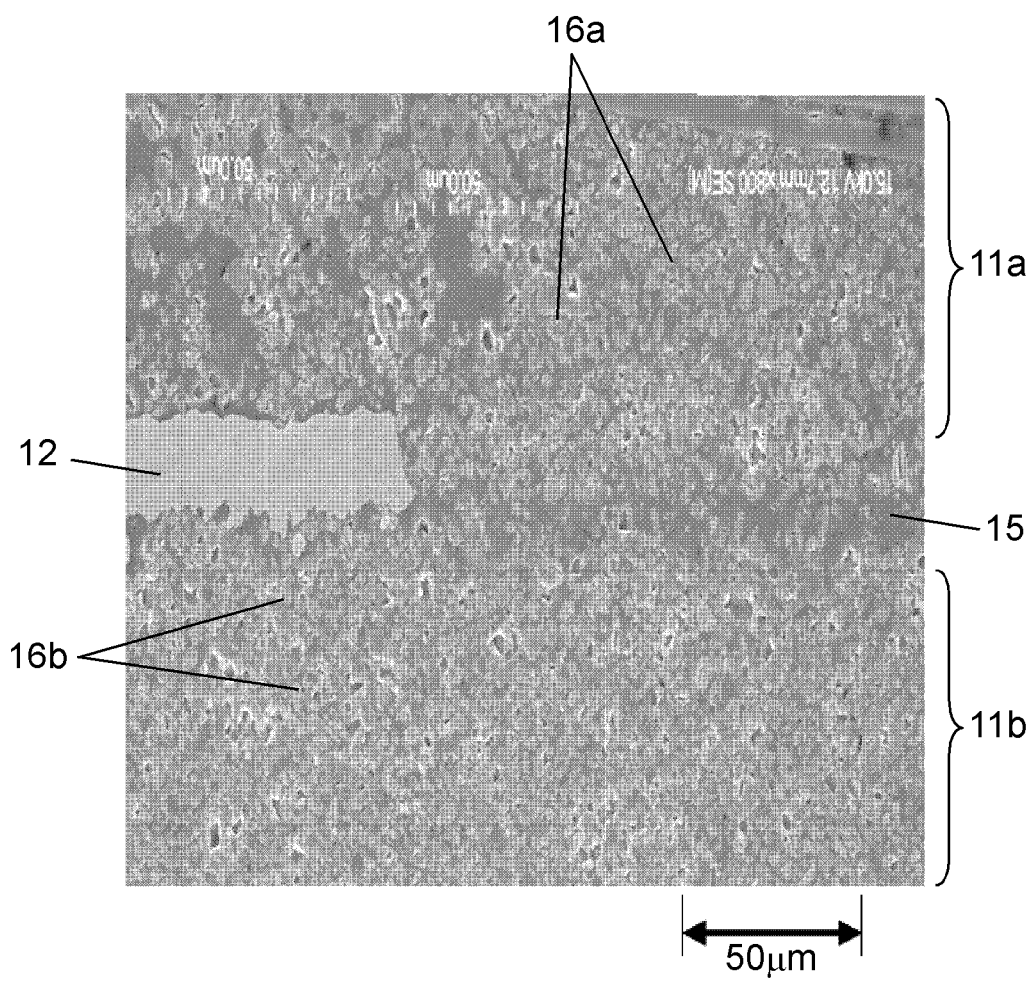
FIG. 4 is an electron micrograph showing a structure of the vicinity of a wiring pattern.

FIG. 4 is an electron micrograph of a structure of the vicinity of the wiring pattern. FIG. 4 is an electron micrograph showing a structure of the vicinity of the wiring pattern on the inner layer and a sectional view showing a part of the sample experimentally produced by the present inventors.

As shown in FIG. 4, layers 11a and 11b filled with inorganic filler 16 are strongly fixed to each other by way of wiring pattern 12 and resin-filled layer 15 formed therebetween.

As shown in FIG. 4, concavity and convexity provided on the surface of wiring pattern 12 and concavity and convexity provided on resin-filled layer 15 (reference numeral is not given to the concavity and convexity, but the concavity and convexity correspond to, for example, the concavity and convexity caused by pores 13 shown in FIG. 3 or FIG. 3) are useful for strongly fixing the plurality of insulating layers 11 to each other.

As shown in FIG. 4, resin-filled layer 15 is provided at insulating layer 11b side on substantially the same plane as that of wiring pattern 12.

It is useful to allow a resin content of the other adjacent insulating layer to enter into at least a part of resin-filled layer 15. For example, it is useful that the semi-hardened second resin is filled from the adjacent layer into pores 13 produced by hardening the first resin. Thus, the anchoring effect of the roughened surface caused by pores 13 provided on the surface of resin-filled layer 15 for adhesively bonding adjacent insulating layers 11 and inorganic filler 16b is obtained. Furthermore, it is possible to obtain an effect of strengthening the adhesion between insulating layers 11 and suppressing internal structural defects such as delamination.

Next, the sample shown in FIG. 4 is described in detail. Resin-filled layer 15 in the sample shown in FIG. 4 has a cross-section for observation, in which the sample is filled with resin and polishing is carried out by, for example, ion milling treatment for observation. It is desirable that resin-filled layer 15 contains air but it may be formed by dissolving inorganic filler with a residual solvent content or a liquid-state low-molecular component or water, furthermore, an acid solution used in a plating process.

Herein, resin-filled layer 15 can be formed by selectively eluting inorganic filler 16b with an acid solution used mainly in plating process or patterning process, by selecting materials having high solubility with respect to insulating layer 11b (or in inorganic filler 16 contained in build-up layer 20 described in, for example, FIG. 9 mentioned below).

Herein, when pore 13 is formed in the elution process, the size of resin-filled layer 15 uses the size of inorganic filler 16b contained in insulating layer 11b (furthermore, build-up layer 20 of, for example, FIG. 9 mentioned below), and thereby the size is adjusted to be 0.5 to 5.0 times as large as an average particle diameter of inorganic filler 16b. The size of pores 13 can be controlled by varying pH of the acid solution used in the patterning process, kinds of the solutions, treating time, or the like.

Furthermore, the size of resin-filled layer 15 can be controlled also by adding inorganic filler that does not have solubility (or low dissolution rate) with respect to the above-mentioned acid solution into inorganic filler having high solubility and mixing thereof.

Next, a case in which inorganic filler 16b is surface-treated with, for example, a surface treatment agent is described. When through holes (not shown) and via holes are processed by using a drill, a laser, and the like, since the surface of inorganic filler 16b is physically cut or denatured, a new surface that has not been surface-treated is exposed. Thereafter, since elution proceeds from the exposed new surface with an acid solution in the plating process or the patterning process, the size of the resultant resin-filled layer 15 is hardly changed.

Figure 5:
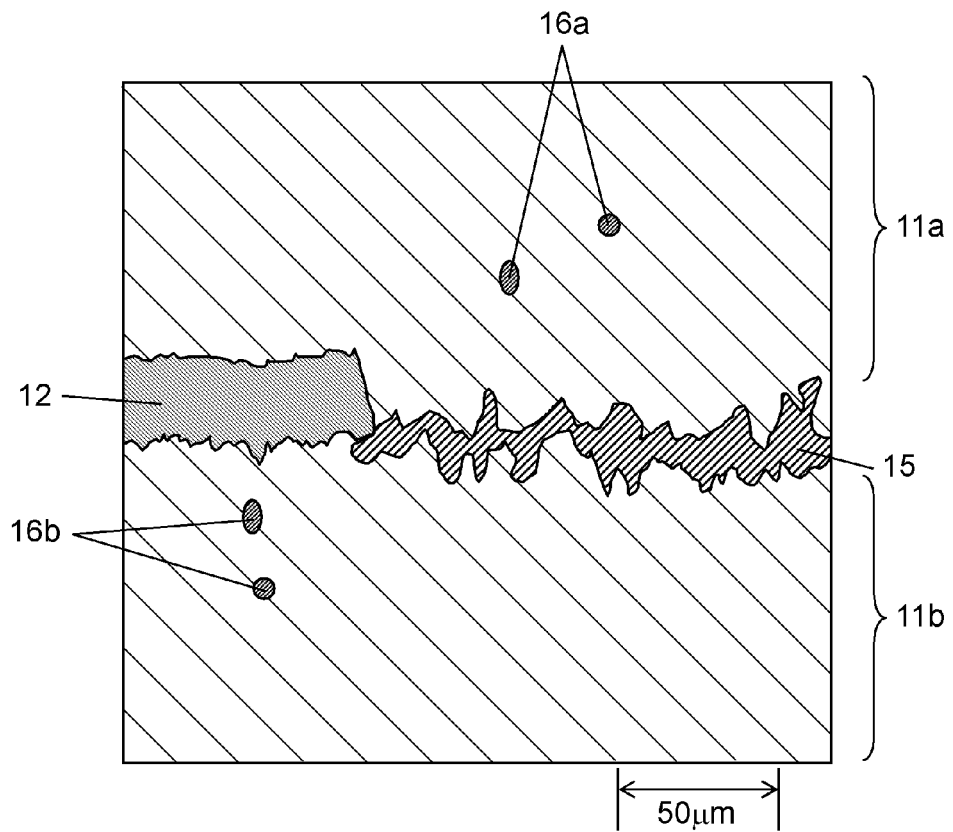
FIG. 5 is an enlarged sectional view of a main part schematically showing the structure of the vicinity of the wiring pattern.

FIG. 5 is an enlarged sectional view of a main part schematically showing a structure of the vicinity of the wiring pattern of the inner layer shown in FIG. 4.

As shown in FIG. 5, insulating layers 11a and 11b filled with inorganic filler 16a and 16b are strongly fixed to each other by wiring patterns 12 and resin-filled layers 15 that are formed therebetween.

In particular, as shown in FIG. 5, concavity and convexity (the concavity and convexity are formed by filling at least a part of pores 13 with resin 17a constituting insulating layer 11a as shown in FIG. 3, and the diameter, pitch, density, and the like, of the concavity and convexity correspond to those of inorganic filler 16b) are provided on the surface of resin-filled layer 15. The concavity and convexity caused by pores 13 allow plurality of adjacent insulating layers 11 to be strongly fixed to each other.

Note here that as shown in FIG. 5, resin-filled layer 15 is provided on substantially the same plane as that of wiring pattern 12, and furthermore, is provided on substantially the same plane as an interface between wiring pattern 12 and insulating layers 11a and 11b.

In FIG. 4 and FIG. 5, pores 13 are not clear. This is thought to be because resin (for example, resin 17a, and resin 17a is not shown) constituting insulating layer 11a is filled into almost all pores 13 by pressurizing and adhesively bonding unhardened insulating layer 11a to hardened insulating layer 11b so as to form resin-filled layer 15.

As mentioned above, printed wiring board 14 includes one or more insulating layers 11, a plurality of layers of wiring patterns 12 made of copper foil, which are alternately laminated on insulating layers 11 in the thickness direction, and a plurality of pores 13 provided between wiring patterns 12 that are adjacent to each other in the plane direction. Insulating layer 11 includes at least resin 17, glass woven fabric and/or nonwoven fabric 18, and inorganic filler 16 whose content is 30 vol. % or more and 70 vol. % or less with respect to insulating layer 11. Furthermore, pores 13 in printed wiring board 14 are provided in insulating layers 11a and 11b on substantially the same plane as the plane provided with a plurality of wiring patterns 12 that are adjacent to each other in the plane direction. Thus, the strength of printed wiring board 14 can be enhanced.

Note here that in FIGS. 1 and 2 mentioned above, printed wiring board 14 includes a plurality of insulating layers 11, a plurality of layers of wiring patterns 12 made of copper foil, which are laminated by way of insulating layers 11 in the thickness direction, and a plurality of pores 13 provided between wiring patterns 12 that are adjacent to each other in the plane direction. Insulating layer 11 includes at least resin 17, glass woven fabric and/or nonwoven fabric 18, and inorganic filler 16 whose content is 30 vol. % or more and 70 vol. % or less with respect to insulating layer 11.

Furthermore, it is useful to use resin-filled layer 15 obtained by filling at least a part of pores 13 with resin 17 of the other adjacent insulating layers laminated in the thickness direction. In this way, resin constituting a plurality of the adjacent insulating layers are laminated by way of pores 13 (for example, in FIG. 3 mentioned above, in such a manner that for example, a prepreg containing unhardened resin 17a is laminated on pores 13 formed on resin insulating layer 11b in which resin 17 is hardened), an effect of enhancing the adhesion strength between plurality of insulating layers 11 can be obtained.

Herein, it is useful that resin-filled layer 15 is formed on substantially the same plane as one interface of wiring pattern 12. Furthermore, when the average thickness of resin-filled layers 15 is made to be thinner than the average thickness of wiring patterns 12, printed wiring board 14 can be thinned and strengthened. Both the thickness of resin-filled layer 15 and the thickness of wiring pattern 12 are evaluated based on the average thickness. This is because both resin-filled layer 15 and wiring pattern 12 have a roughened surface for the anchoring effect. Note here that the thickness can be measured from a photograph of a cross section, and the like.

It is desirable that resin-filled layer 15 has lower content of inorganic filler 16 as compared with insulating layer 11 filled with inorganic filler 16 laminated adjacently. In resin-filled layer 15, by providing a portion having the volume fraction of inorganic filler 16 of 10 vol. % or less with respect to insulating layer 11, an effect of increasing the adhesion force of resin-filled layer 15 can be obtained. This is thought to be because the higher the volume fraction of inorganic filler 16 in resin-filled layer 15 is, the lower the adhesion force becomes.

Next, evaluation results of the properties of printed wiring board 14 produced by the present inventors are described with reference to Table 1.

Table 1 shows an example of the evaluation results of a six-layer through hole substrate experimentally produced by the present inventors based on FIG. 1 and the like. In Table 1, Example 1 is a case in which resin-filled layer 15 is provided and Comparative Example 1 is a case in which resin-filled layer 15 is not provided. In Example 1 and Comparative Example 1, solder heat resistance after moisture absorption is evaluated. Water absorption conditions and the results are shown below.

TABLE 1

| | | Water absorption conditions | | |
|---|---|---|---|---|
| | Structure | Jedec.Lv3 (40° C.-90%-192 hrs) | Jedec.Lv2 (80° C.-60%-168 hrs) | Jedec.Lv1 (85° C.-85%-168 hrs) |
| Example 1 | Six-layer through hole substrate | ○○○ | ○○○ | ○○○ |
| Comparative Example 1 | Six-layer through hole substrate | ○○○ | ○xx | xxx |

○: In solder floating at 260° C., no swelling occurs for 180 seconds
x: In solder floating at 260° C., swelling occurs in 180 seconds From the above description, it is shown that Example 1 including resin-filled layer 15 exhibits excellent solder heat resistance after moisture absorption. This is thought to be because resin-filled layer 15 improves the adhesion between the insulating layers in the inner layer portion in Example 1 and eliminates minute internal structural defects such as delamination which may cause defectives in the solder heat resistance after moisture absorption.

Second Exemplary Embodiment

Next, as a second exemplary embodiment, improvement of adhesion of resist to be provided on the outermost layer of printed wiring board 14 is described.

Figure 6:
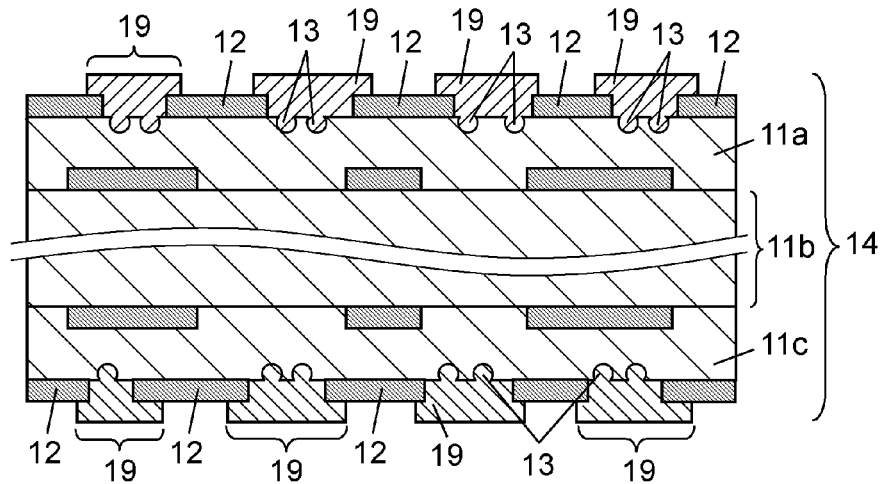
FIG. 6 is a sectional view showing an example of a structure of a printed wiring board having resist on an outermost layer in accordance with a second exemplary embodiment of the present invention.

FIG. 6 is a sectional view showing an example of a structure of a printed wiring board in which resists are provided on the outermost layers. Resists 19, for example, photo-sensitive solder resists are shown in FIG. 6. In FIG. 6, a part of resists 19 may be provided such that they cover wiring pattern 12 provided on the outermost layers of printed wiring board 14 (this case is not shown).

In printed wiring board 14 shown in FIG. 6, a plurality of insulating layers 11a, 11b and 11c are laminated by way of a plurality of pores 13, resin-filled layer 15 (not shown in FIG. 6) or the like provided adjacent to incorporated wiring patterns 12.

As shown in FIG. 6, a plurality of pores 13 are provided on insulating layers 11a and 11c expressed to the outermost layers of printed wiring board 14 (or between wiring patterns 12 provided on the outermost layers), and resist-filled layers filled with resist 19 are formed on at least a part of pores 13. In this way, resist 19 is filled in at least a part of pores 13 provided in portions to which wiring patterns 12 of the outermost layer are exposed on insulating layers 11a and 11c provided on the outermost layers of printed wiring board 14 so as to form a resist-filled layer. Thus, the adhesion force of resist 19 with respect to insulating layers 11a and 11c by an anchoring effect can be improved.

Figure 7:
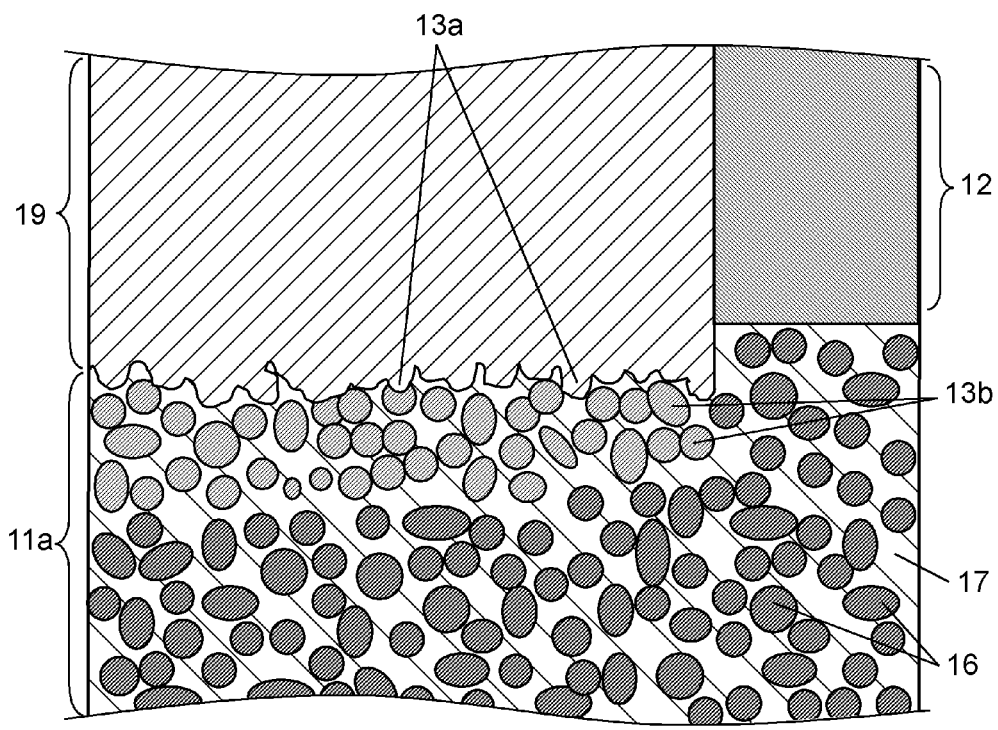
FIG. 7 is an enlarged sectional view of a main part schematically showing a structure of the vicinity of an interface between the resist and an insulating layer.

Next, description in more detail is given below with reference to FIG. 7. FIG. 7 is an enlarged sectional view of the vicinity of an interface between the resist and the insulating layer, and corresponds to an enlarged view of the interface portion between resist-filled layer resist 19 and insulating layer 11a shown in FIG. 6.

As shown in FIG. 7, a part of pores 13 is filled with a part of resists 19. Furthermore, by filling at least a part of pores 13 with a part of resists 19, an anchoring effect is achieved, and the adhesion force between resist 19 and insulating layer 11 can be enhanced.

As shown in FIG. 7, it is useful that pores 13b are allowed to remain in a form of a layer in the interface portion between resist 19 and insulating layer 11a (note here that pores 13a in FIG. 7 correspond to pores filled with resist 19, and correspond to, for example, resin-filled layer 15 as shown in FIG. 3 mentioned above. Furthermore, pores 13b correspond to portions that remain as intact pores).

Third Exemplary Embodiment

Next, application to a printed wiring board having a build-up layer is described with reference to FIG. 8.

Figure 8:
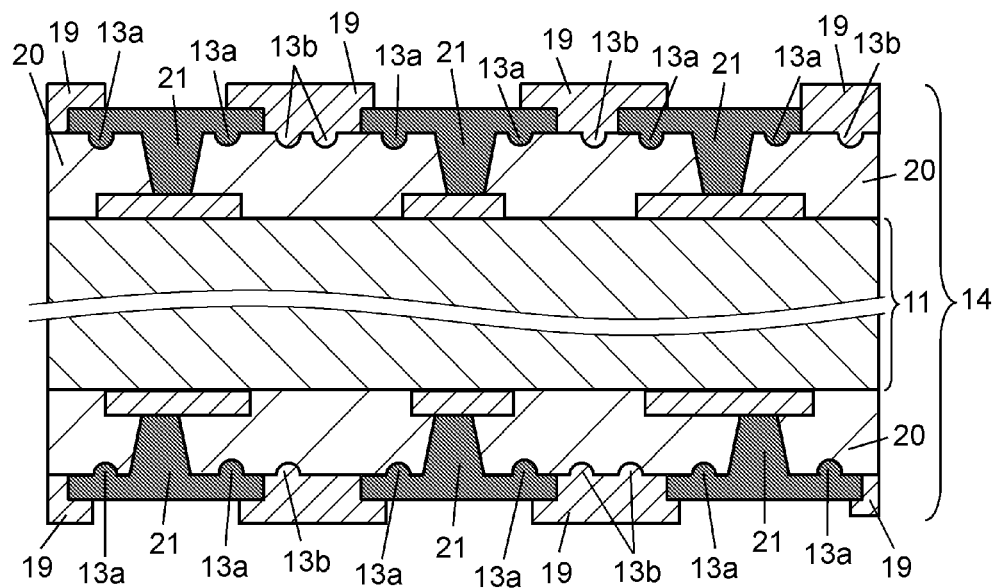
FIG. 8 is a sectional view illustrating an increase in an adhesion force of a plated conductor in a printed wiring board having a build-up layer in accordance with a third exemplary embodiment of the present invention.

FIG. 8 is a sectional view illustrating the improvement of an adhesion force of a plated conductor in a printed wiring board having the build-up layer.

Build-up layer 20, and plated conductor 21 are shown in FIG. 8. Plated conductor 21 provided in build-up layer 20 is formed of, for example, copper wiring, copper via holes, or the like, by using plating techniques such as copper plating.

When plated conductor 21 is used for a surface layer and the like if necessary, a via electrode formed on build-up layer 20 (the via electrode corresponds to an interlayer connection portion between a plurality of wiring) or wiring (the wiring corresponds to wiring patterns 12 formed by plating on the surface layer or the inner layer of build-up layer 20) can be formed finely and densely.

Note here that build-up layer 20 is not necessarily allowed to contain glass woven fabric or glass nonwoven fabric. Furthermore, it is useful that build-up layer 20 is allowed to contain inorganic filler 16 (not shown). Furthermore, it is useful that a plurality of build-up layers 20 are provided and plated conductor 21 is used for connecting between layers of build-up layer 20.

As shown in FIG. 8, it is useful that a via portion of build-up layer 20 and a wiring portion on the surface layer of build-up layer 20 are formed in a state in which they are integrated with each other by plated conductor 21.

As shown in FIG. 8, one or more build-up layers 20 are provided on the surface layer of insulating layer 11 as a core layer. Pores 13a are provided on the surface that is brought into contact with build-up layer 20 of plated conductor 21 provided on the surface layer of build-up layer 20. At least a part of plated conductor 21 is filled inside pores 13a to form concavity and convexity (or roughened surface) integrated with plated conductor 21. In this way, when concavity and convexity (or roughened surface) filled with plated conductor 21 are formed in at least a part of pores 13a, the connection strength between plated conductor 21 and build-up layer 20 can be enhanced.

In FIG. 8, pores 13b are provided on the surface on which resist 19 provided on the surface layer of build-up layer 20 is brought into contact with build-up layer 20. At least a part of resists 19 is filled inside pores 13b to form concavity and convexity (or roughened surface) integrated with resist 19. In this way, when concavity and convexity (or roughened surface) are formed by filling resist 19 in at least a part of pores 13b, the connection strength between resist 19 and build-up layer 20 can be enhanced.

Pores 13 provided between build-up layer 20 and plated conductor 21 are described with reference to FIG. 9.

Figure 9:
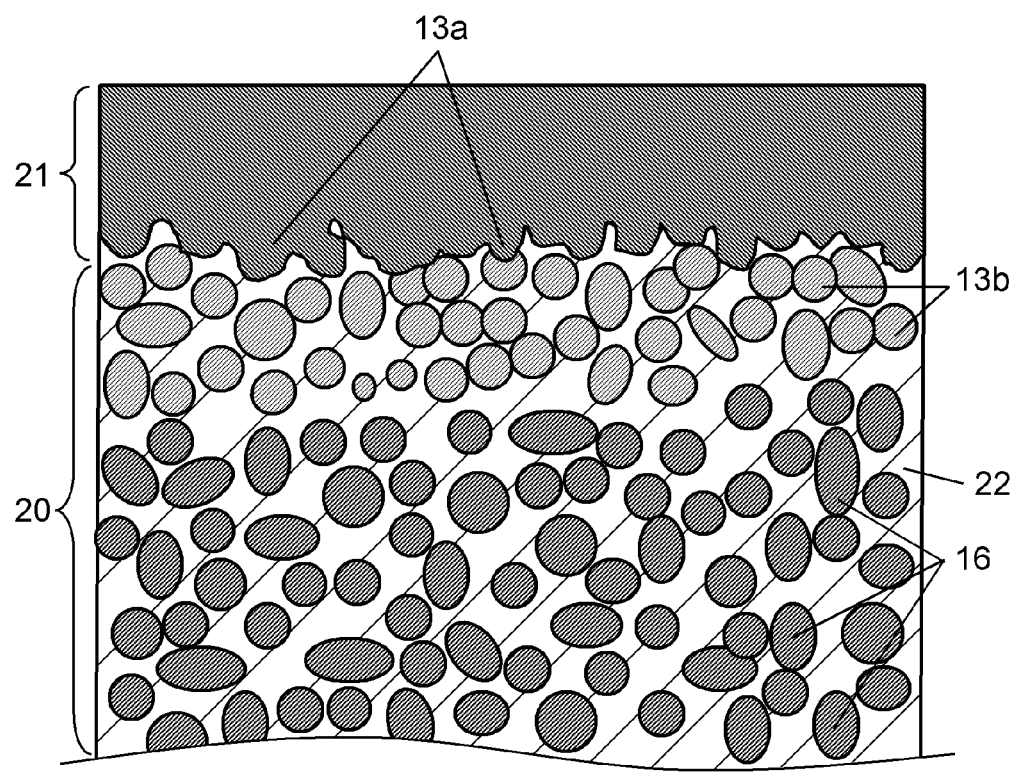
FIG. 9 is an enlarged sectional view of a main part schematically showing a structure of an interface between a wiring pattern provided on the build-up layer and the build-up layer.

FIG. 9 is an enlarged sectional view of a main part schematically showing a structure of an interface between the wiring pattern provided on the build-up layer and the build-up layer, and FIG. 9 corresponds to, for example, an interface portion between build-up layer 20 and plated conductor 21 in FIG. 8.

Build-up resin 22 is shown in FIG. 9. Build-up resin 22 is not necessarily made of the same resin as that of insulating layer 11. When, for example, photosensitive or laser-degradable resin materials are used as build-up resin 22, holes in which plated conductor 21 is formed, can be finely formed.

As shown in FIG. 9, build-up layer 20 includes at least inorganic filler 16 and build-up resin 22. Furthermore, a plurality of pores 13a and 13b caused by inorganic filler 16 are formed at plated conductor 21 side of build-up layer 20. Note here that when metallic materials (for example, copper) constituting plated conductor 21 are formed in at least a part of the inside of pores 13a and 13b, concavity and convexity (or a roughened surface) caused by pores 13 and inorganic filler 16 can be formed on the surface of plated conductor 21. With the concavity and convexity (or the roughened surface), the adhesion strength between plated conductor 21 and build-up layer 20 can be enhanced.

Next, evaluation results of printed wiring board 14 including build-up layer 20 shown in FIG. 8 are described with reference to Table 2.

Table 2 shows a six-layer build-up substrate in which surface layer wiring pattern 12 is formed of plated conductor 21 including a via in a part thereof, which is provided in build-up layer 20. Then, predetermined fine wiring is provided in build-up layer 20 including plated conductor 21.

In Table 2, a six-layer build-up substrate in which pores 13 or resin-filled layers 15 are formed on the interface between fine wiring including plated conductor 21 and build-up layer 20 is defined as Example 2.

In Table 2, a six-layer build-up substrate including neither resin-filled layer 15 or pores 13 is defined as Comparative Example 2. Examination results by the present inventors are shown in Table 2.

TABLE 2

|  | Structure | L/S | | |
| --- | --- | --- | --- | --- |
|  |  | 80/80 | 60/60 | 40/40 |
| Example 2 | Six-layer build-up substrate | ◯ | ◯ | ◯ |
| Comparative Example 2 | Six-layer build-up substrate | ◯ | ◯ | x |

◯: wiring can be formed
x: wiring cannot be formed

According to Table 2, in Comparative Example 2, since the adhesion between the wiring pattern and the build-up layer of the surface layer is poor when fine wiring of L/S=40 μm/40 μm is formed, peeling of the wiring occurs, so that the wiring cannot be formed. In contrast, in Example 2, peeling of the wiring does not occur, and fine wiring of L/S=40 μm/40 μm can be formed. This is because the fine wiring is adhesively formed on build-up layer 20 with high density by using plated conductor 21.

As mentioned above, when pores 13 are provided, even when the wiring patterns provided on the surface layer or the inner layer of build-up layer 20 are formed by plated conductor 21, the adhesion with respect to build-up layer 20 can be enhanced by pores 13 or resin-filled layer 15 made of aggregate of pores 13, which shows that finer patterns can be achieved.

In Table 2, it is also useful that resin-filled layer 15 may be a plated conductor-filled layer in which a plurality of pores 13 are filled with plated conductor 21 with a high density. This is because it is useful that resin is filled in pores 13, and plated conductor 21 or resist 19 is segregated in pores 13.

Fourth Exemplary Embodiment

A fourth exemplary embodiment describes, with reference to FIGS. 10 to 13, an example of a production method for printed wiring board 14 described in, for example, the first exemplary embodiment.

Figure 10A:
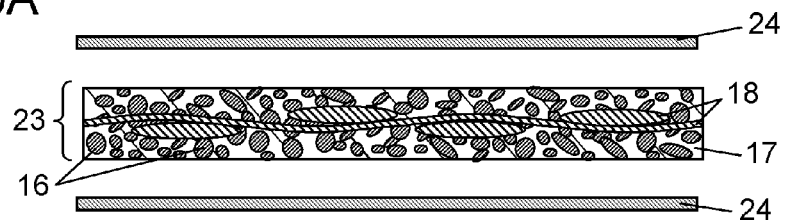
FIG. 10A is a sectional view of a step illustrating a state in which copper foil is formed on both surfaces of a prepreg in accordance with a fourth exemplary embodiment of the present invention.
Figure 10B:
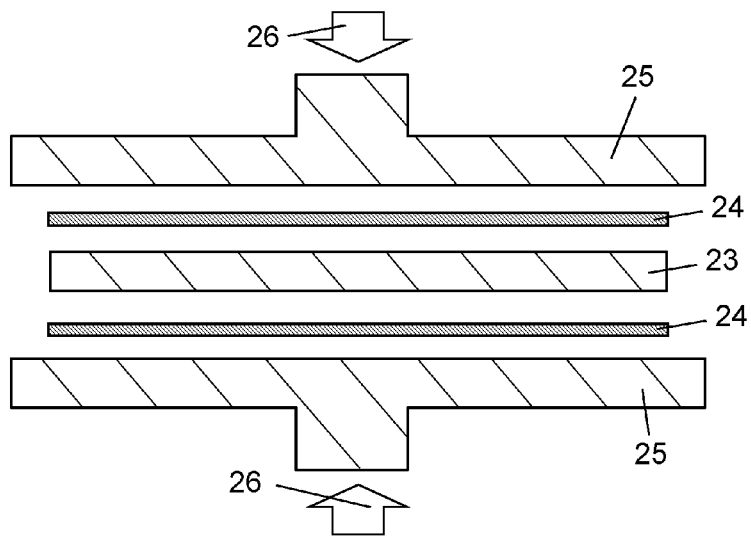
FIG. 10B is a sectional view of a step illustrating a state in which the copper foil is formed on both surfaces of the prepreg.
Figure 10C:
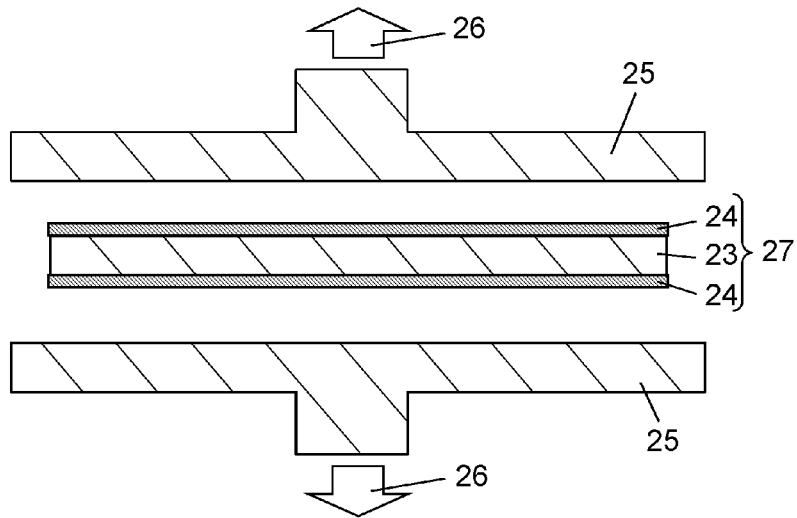
FIG. 10C is a sectional view of a step illustrating a state in which the copper foil is formed on both surfaces of the prepreg.

FIGS. 10A to 10C are sectional views of steps illustrating a state in which copper foil is provided on both surfaces of a prepreg.

Prepreg 23, copper foil 24 (metal foil made of other metallic material instead of copper foil 24 may be used, but it is useful to use copper in terms of cost), press 25 (a mold or the like is not shown, and a heating device or the like attached to press 25 is not shown), an arrow 26 showing a pressing direction, and laminated body 27 are shown in FIG. 10.

As shown in FIG. 10A, prepreg 23 includes at least glass woven fabric and/or nonwoven fabric 18, inorganic filler 16, and resin 17 for fixing thereof (the resin is desirably in a semi-hardened state or a B-stage stage state).

In FIGS. 10A and 10B, resin 17 is in a semi-hardened state; and in FIG. 10C, resin 17 is in a hardened state. In FIGS. 10B and 10C, resin 17 is not shown.

As shown in FIG. 10A, copper foil 24 is placed on both surfaces of prepreg 23.

FIG. 10B is a sectional view illustrating a state in which prepreg 23 and copper foil 24 are integrated with each other by moving presses 25 in the direction shown by arrows 26. It is useful to heat presses 25 or the like.

FIG. 10C is a sectional view showing a state in which laminated body 27 obtained by integrating prepreg 23 and copper foil 24 with each other is produced.

Next, a state in which wiring pattern 12 is formed by etching copper foil 24 provided on the surface of laminated body 27 is described with reference to FIGS. 11A and 11B.

Note here that steps of patterning of copper foil 24 (coating, exposure, and development of a photoresist, etching of copper foil 13, removal of the photoresist, and the like) are not shown (omitted).

Figure 11A:
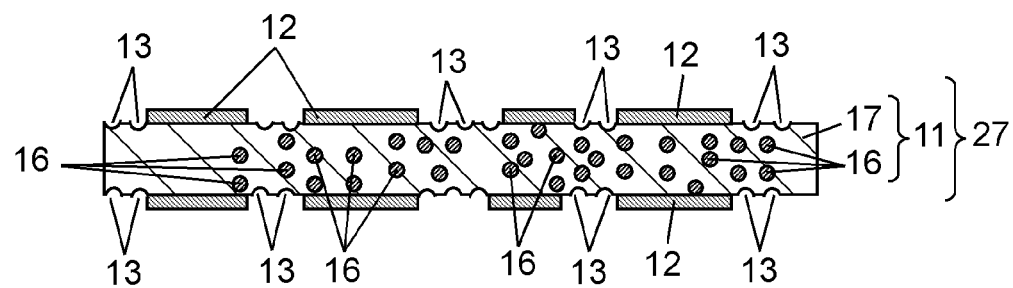
FIG. 11A is a sectional view showing a state in which a wiring pattern is formed on a surface of a laminated body.
Figure 11B:
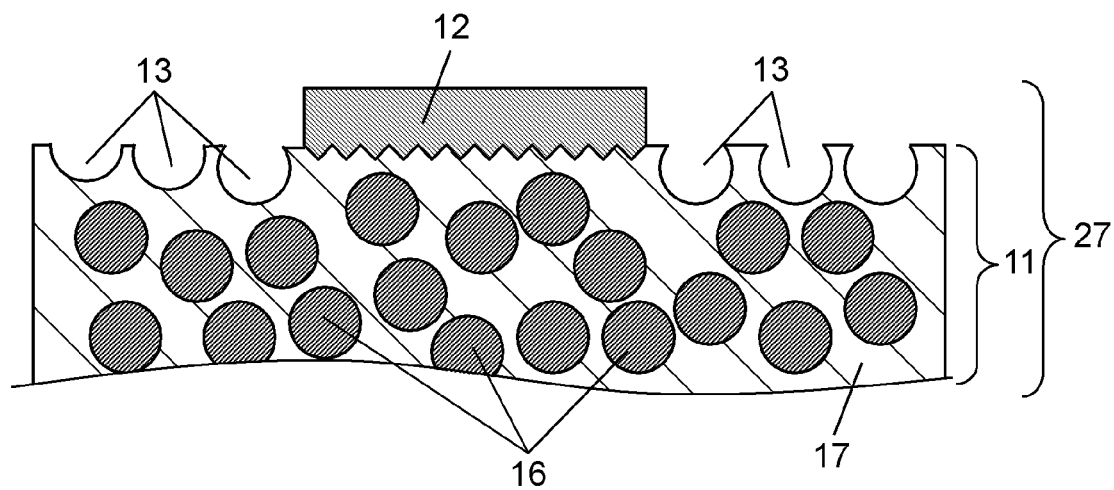
FIG. 11B is an enlarged sectional view of a main part thereof.

FIGS. 11A and 11B are sectional views showing a state in which wiring patterns 12 are formed on the surface of laminated body 27.

In FIG. 11A, pores 13 are formed on the surface of insulating layer 11 expressed between wiring patterns 12.

FIG. 11B is an enlarged view showing a main part of FIG. 11A. As shown in FIG. 11B, it is useful for improving adhesion that wiring pattern 12 at insulating layer 11 side is subjected to surface-roughening treatment by pores 13. Furthermore, pores 13 are provided on the portion which is not covered with wiring patterns 12 and to which insulating layer 11 is expressed. In FIG. 11B, pores 13 are shown in a single layer (or one layer), but it is useful that a layer is formed to have a thickness of a plurality of layers in the thickness direction as shown in, for example, FIG. 3.

In FIG. 11A and FIG. 11B, formation of wiring patterns 12 can be carried out by a combination of a process of attaching copper foil 24 and etching thereof and an electroless plating process or an electrolytic plating process. Then, with acid treatment in the process, wiring pattern 12 on the surface layer is patterned and, at the same time, inorganic filler 16 on the surface of insulating layer 11 is eluted. Thereby, pores 13 can be formed.

Note here that it is useful to form resin-filled layer 15 by filling at least a part of pores 13 with resin 17 (not shown in FIG. 11). When pores 13 and resin-filled layer 15 are provided in this way, wiring on printed wiring board 14 can be made to be fine and adhesion of each region can be enhanced.

Note here that when build-up layer 20 as shown in FIG. 8 is formed, in the step of etching and the like of wiring patterns 12 provided on build-up layer 20 (or wiring formed of plated conductor 21), pores 13 and resin-filled layer 15 can be formed by eluting inorganic filler 16 with an acid solution.

Next, pores 13 provided on the surface layer of laminated body 27 are described with reference to FIGS. 12A to 12C.

Figure 12A:
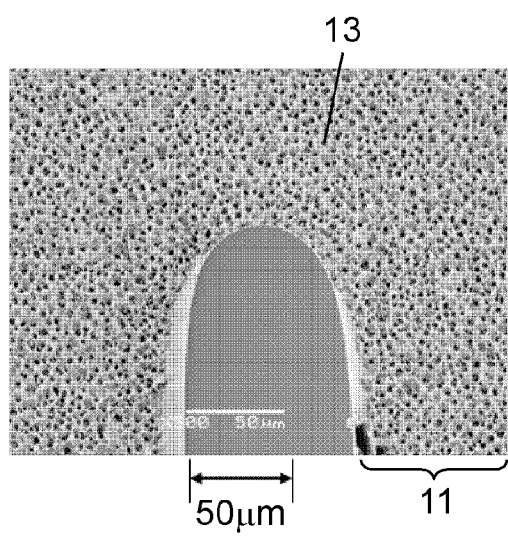
FIG. 12A is an electron micrograph showing a state in which a pore is formed.
Figure 12B:
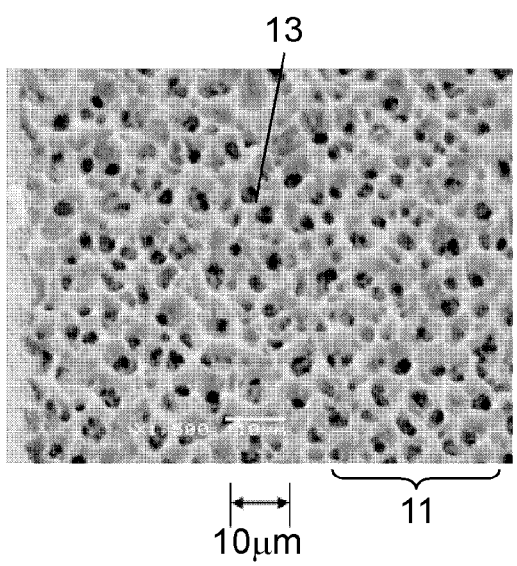
FIG. 12B is an enlarged sectional view of a main part thereof.
Figure 12C:
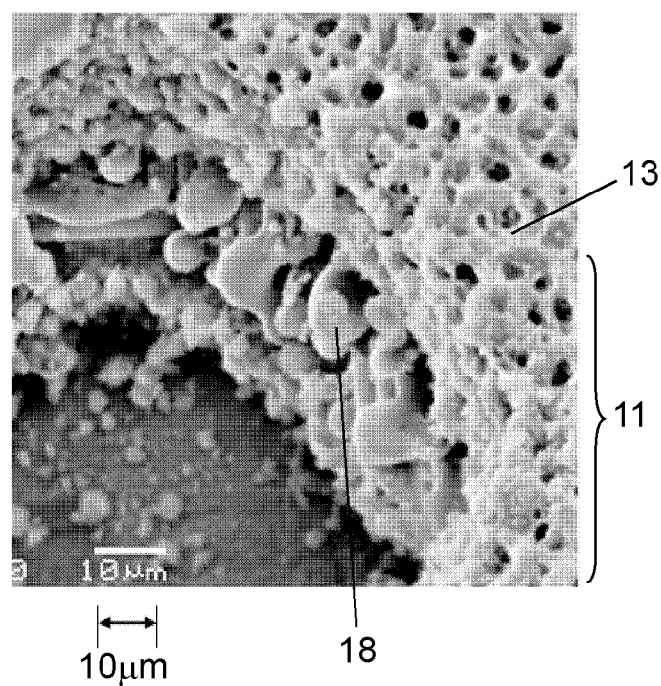
FIG. 12C is an enlarged sectional view of a main part thereof.

FIGS. 12A to 12C are electron micrographs showing a state in which pores 13 are formed.

As shown in FIGS. 12A to 12C, by providing a plurality of pores 13 on the surface of insulating layer 11, an effect of increasing an adhesion force with respect to other insulating layers (not shown) can be achieved.

Figure 13A:
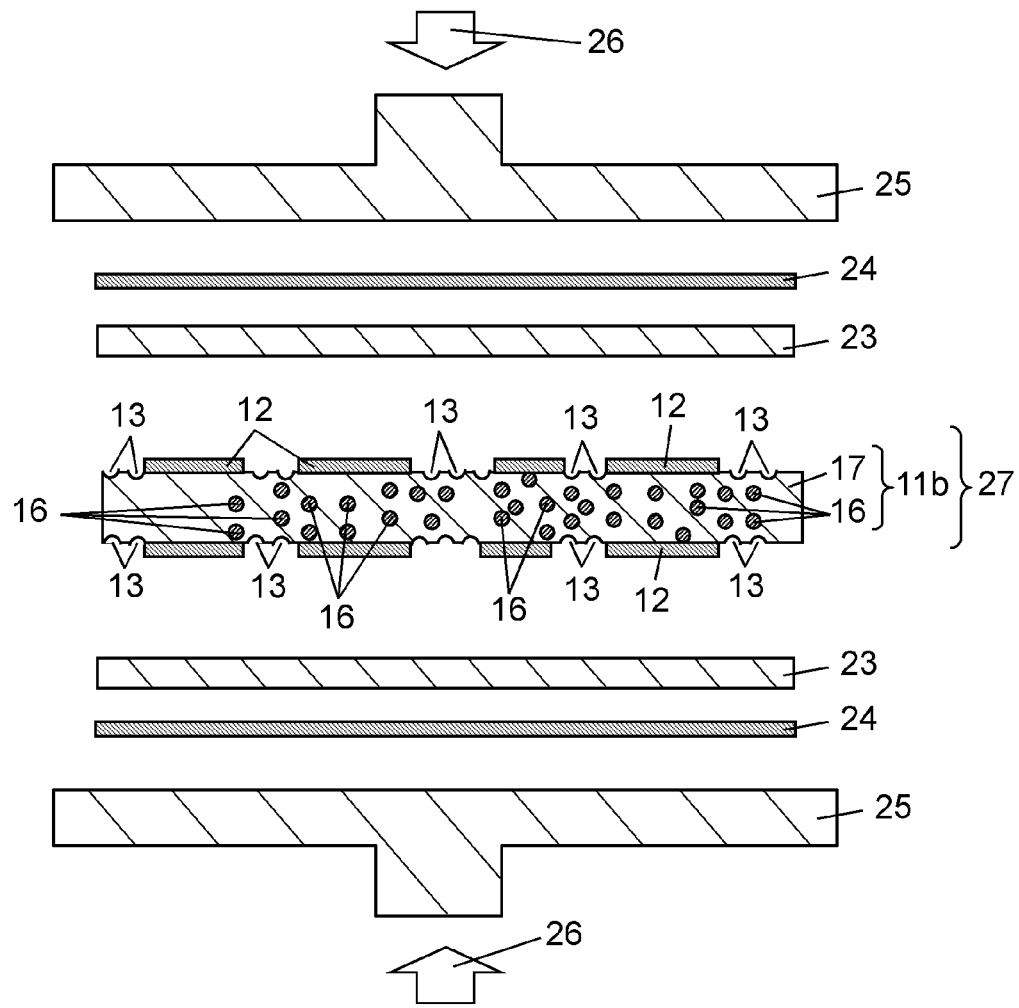
FIG. 13A is a sectional view of a step showing a state in which the copper foil is laminated on the laminated body provided with the pores by way of the prepreg.
Figure 13B:
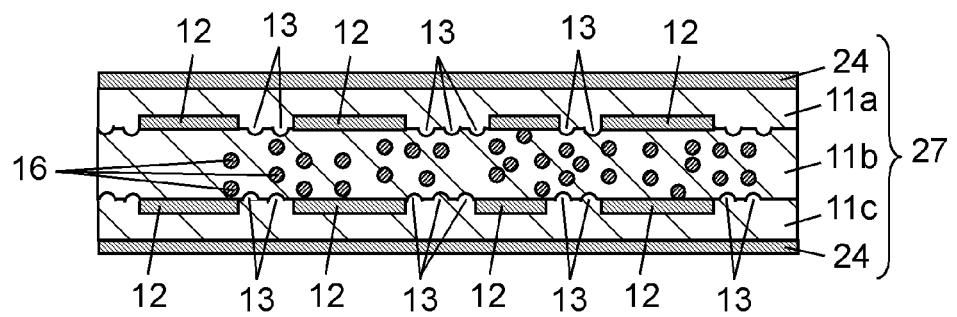
FIG. 13B is a sectional view of a step showing a state in which the copper foil is laminated on the laminated body provided with the pores by way of the prepreg.

FIG. 13A and FIG. 13B are sectional views of steps showing a state in which copper foil 24 is laminated on laminated body 27 having pores 13 by way of prepreg 23.

FIG. 13A shows a state before laminating, and FIG. 13B shows a state after laminating. After FIG. 13B, by repeating formation of wiring patterns 12 by patterning copper foil 24 on the outermost layer shown in FIGS. 11A and 11B mentioned above, and formation of a plurality of pores 13 on the surface of insulating layer 11, a multi-layer structure can be achieved.

As mentioned above, by repeating the steps of FIGS. 10, 11, and 13 a plurality of times, printed wiring board 14 shown in FIG. 1 can be produced.

Furthermore, after steps shown in FIGS. 10, 11, and 13 are repeated a plurality of times, for example, prepreg 23 in FIG. 13A and build-up layer 20 are provided, and finally, resist 19 made of, for example, photosensitive solder resist is formed. Thereby, printed wiring board 14 shown in FIG. 6 mentioned above can be produced.

Furthermore, by forming pores 13 on the surface of build-up layer 20 including build-up resin 22 and inorganic filler 16, and further forming plated conductor 21, build-up printed wiring board 14 shown in FIG. 8 mentioned above can be produced.

As mentioned above, printed wiring board 14 includes a plurality of insulating layers 11, a plurality of layers of wiring patterns 12 made of copper foil 24, which are alternately laminated on insulating layer 11, and plated conductor 21 constituting at least a part of a via. Insulating layer 11 includes at least resin 17, and inorganic filler 16 whose content is 30 vol. % or more and 70 vol. % or less with respect to insulating layer 11. A plurality of pores 13 are provided on the surface of insulating layer 11 exposed between wiring patterns 12, and at least a part of pores 13 is filled with at least a part of plated conductor 21. With such a printed wiring board 14, adhesion strength of plated conductor 21 can be enhanced.

As mentioned above, as shown in FIGS. 10A to 10C, printed wiring board 14 shown in FIG. 1 can be produced by a production method for printed wiring board 14. The method includes laminating copper foil 24 (for example, first copper foil) on at least one surface of prepreg 23 including at least a semi-hardened first resin (for example, semi-hardened resin 17 contained in prepreg 23), glass woven fabric and/or non-woven fabric 18, and inorganic filler 16, and thermally hardening the first resin (for example, resin 17), thereby forming a laminated body having copper foil 24 (for example, a first laminated body); patterning copper foil 24 (for example, as the first copper foil) on a surface layer of the first laminated body as shown in FIGS. 11A and 11B to form wiring pattern 12 as an inner layer and, at the same time, to form a plurality of pores 13 on the surface of insulating layer 11 exposed between wiring patterns 12, thereby forming a hardened sheet having holes; laminating prepreg 23 including copper foil 24 (for example, as second copper foil), a semi-hardened second resin (not shown in FIG. 13), glass woven fabric and/or non-woven fabric, and inorganic filler 16, and the laminated body having pores 13 (for example, a first laminated body) on each other as shown in FIGS. 13A and 13B, and thermally hardening the second resin in a state in which at least a part of pores 13 is filled with at least a part of the second resin, thereby forming laminated body 27 (for example, a second laminated body); and patterning copper foil 24 (for example, the second copper foil) on a surface layer of laminated body 27 (for example, the second laminated body) as shown in FIG. 11, thereby forming wiring pattern 12 as an outer layer.

A production method for printed wiring board 14 includes patterning copper foil 24 on a surface layer to form surface layer wiring pattern 12 and at the same time to form a plurality of pores 13 on the surface of insulating layer 11 exposed between wiring patterns 12; and forming any one or more of plated conductor 21 and resist 19 in at least a part of the plurality of pores 13. With the method, the adhesion strength between resist 19 or plated conductor 21 and insulating layer 11 can be enhanced.

Fifth Exemplary Embodiment

Hereinafter, a printed wiring board in accordance with a fifth exemplary embodiment of the present invention is described with reference to FIGS. 14 to 18.

Figure 14:
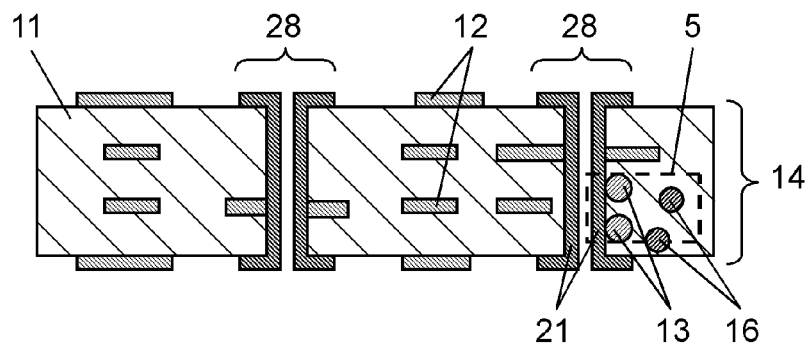
FIG. 14 is a sectional view showing an example of a structure of a printed wiring board in accordance with a fifth exemplary embodiment of the present invention.

FIG. 14 is a sectional view showing an example of a structure of a printed wiring board in accordance with the fifth exemplary embodiment of the present invention. Insulating layer 11 made of, for example, a glass epoxy resin; wiring pattern layer 12 made of, for example, copper foil; through hole 28 obtained by forming a conductor by plating or the like in a hole formed by using, for example, a drill; printed wiring board 14; pores 13; inorganic filler 16; and plated conductor 21 constituting an interlayer connection portion are shown in FIG. 14.

In FIG. 14, printed wiring board 14 includes a laminated body in which insulating layer 11 including at least inorganic filler 16 and resin (not shown) and wiring pattern layers 12 are alternately laminated on each other, and through hole 28 provided with plated conductor 21 electrically connecting between the layers of wiring pattern layers 12.

A portion shown by dotted line 5 in FIG. 14 (a vicinity of the interface between through hole 28 or plated conductor 21 and insulating layer 11) is described with reference to FIG. 2 in more detail.

Figure 15:
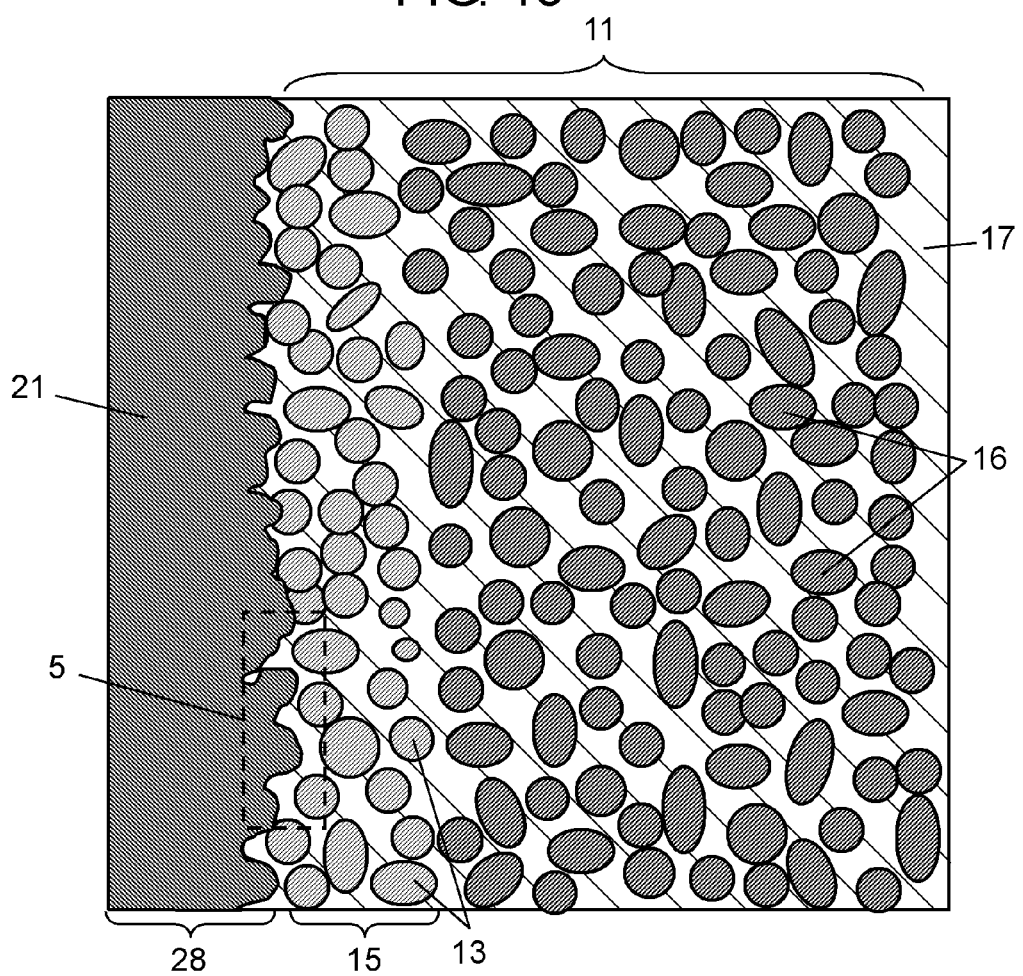
FIG. 15 is an enlarged sectional view of a main part schematically showing a structure of a through hole portion.

FIG. 15 is an enlarged sectional view of a main part schematically showing a structure of through hole 28 portion. Resin 17, for example, a thermosetting resin such as an epoxy resin is shown in FIG. 15. Resin-filled layer 15 includes pores 13 formed by removing inorganic filler 16, and resin 17. It is useful that the size of pore 13 (height, diameter, volume, cross-sectional area, or the like) is allowed to be similar to that of inorganic filler 16.

Furthermore, in FIG. 15, a plurality of protrusions (for example, a portion shown by dotted line 5) are provided in a part (in particular, a surface that is brought into contact with insulating layer 11) of plated conductor 21 forming the wall surface of through hole 28. The presence of such protrusions enhances the adhesion strength between plated conductor 21 and insulating layer 11 by an anchoring effect. It is useful that the size (height, diameter, volume, cross-sectional area, or the like) of the protrusions provided on the surface of plated conductor 21 is allowed to be similar to that of inorganic filler 16.

FIG. 15 shows that in insulating layer 11 that is brought into contact with plated conductor 21 (or that surrounds around 360° of plated conductor 21, or that faces plated conductor 21), a plurality of pores 13 are provided such that they surround through hole 28.

Figure 16:
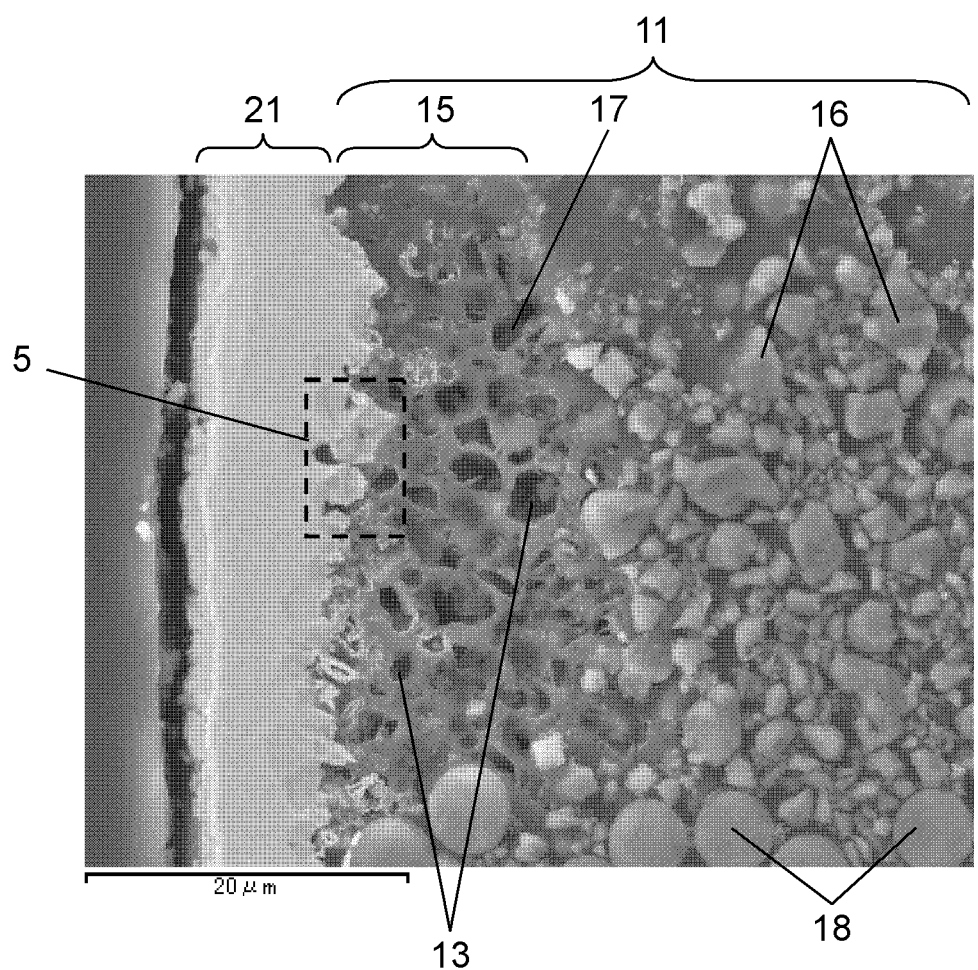
FIG. 16 is an electron micrograph showing the structure of the through hole portion of a sample product.

FIG. 16 is an electron micrograph showing a structure of a through hole portion of a sample product experimentally produced by the present inventors. FIG. 16 corresponds to the sectional view schematically shown in FIG. 15. In FIG. 16, plated conductor 21 forms the wall surface of through hole 28, and a part of plated conductor 21 forms a plurality of protrusions and is embedded in insulating layer 11 as shown by dotted line 5 to exhibit an anchoring effect. Furthermore, in insulating layer 11 that is brought into contact with plated conductor 21, resin-filled layer 15 is provided. Resin-filled layer 15 includes pores 13 and resin 17 filled in at least a part of pores 13 are shown in FIG. 16. The size of pore 13 corresponds to the size (the size may be one or more of height, diameter, volume, and cross-sectional area) of, for example, inorganic filler 16. A plurality of pores 13 are formed so as to surround the periphery of through hole 28.

Figure 17:
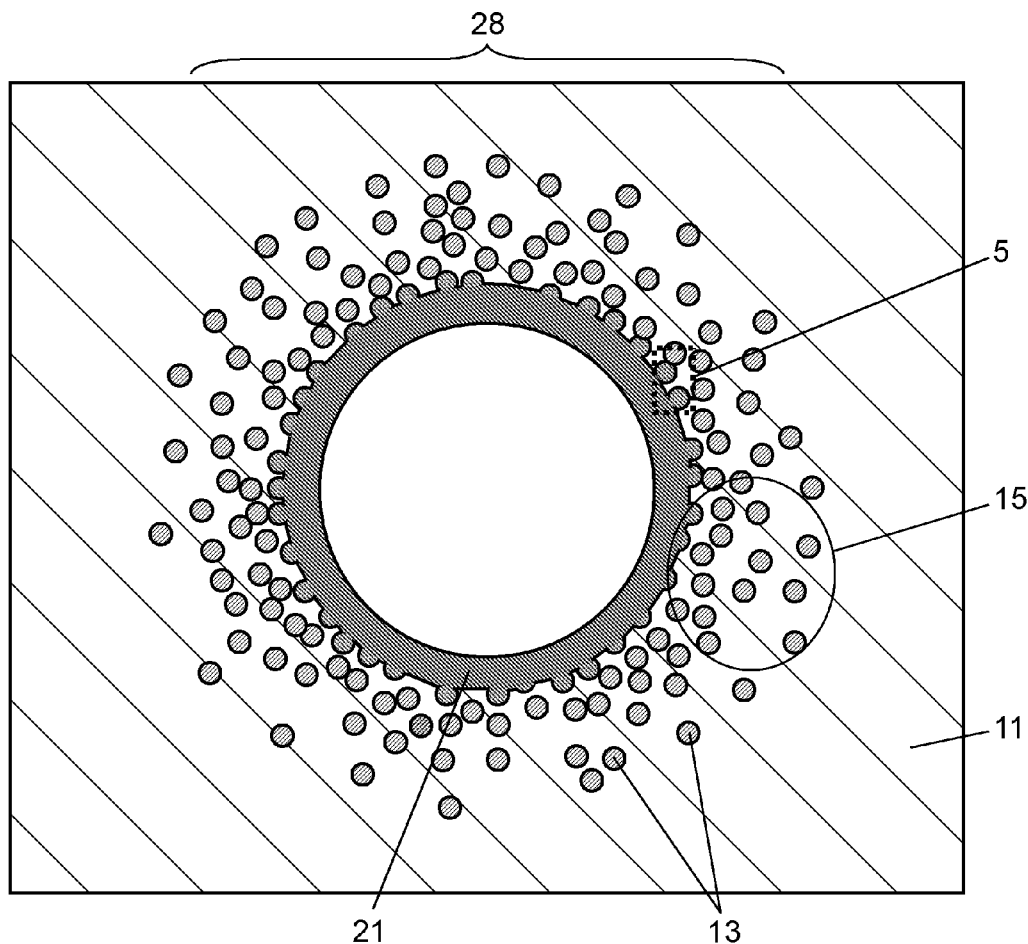
FIG. 17 is a sectional view schematically showing a formation state of pores formed so as to surround the periphery of the through hole.

FIG. 17 is a sectional view schematically showing a state in the plane direction of pores 13 formed so as to surround the periphery of through hole 28.

As shown in FIG. 17, on a wall surface (at insulating layer 11 side) of substantially circular through hole 28, plated conductor 21 is formed. On a portion of plated conductor 21, which is brought into contact with (or facing) insulating layer 11, a plurality of protrusions (surrounded by dotted line 5) are formed. Furthermore, a plurality of pores 13 are formed in the peripheral portion of through hole 28. Note here that the frequency of appearance of pores 13 is set to be higher near through hole 28, and become lower as the distance from through hole 28 increases. Note here that in FIG. 17, inorganic filler is not shown.

In FIG. 17, pores 13 are formed by removing inorganic filler. Therefore, even if the in-plane distribution of inorganic filler in insulating layer 11 is originally uniform, as shown in FIG. 17, in the vicinity of through hole 28, the inorganic filler is reduced and pores 13 are accordingly increased by a content in which inorganic filler is removed by etching and the like. That is to say, FIG. 17 shows that in the vicinity of through hole 28, nearer to through hole 28, the frequency (or frequency of occurrence) of pores 13 is increased, and the frequency (or frequency of occurrence) of the inorganic filler is accordingly reduced.

As shown in FIG. 17, when through hole 28 portion is observed from the upper surface, the amount of pores 13 is larger near plated conductor 21, and becomes smaller as the distance from plated conductor 21 increases. Pores 13 shown herein are pores that can be seen in an observation cross-section after samples are filled with resin and polished by ion milling treatment. Pores 13 may be filled with an insulating material having a low dielectric constant, for example, air.

By forming plated conductor 21 in at least a part of pores 13, a plurality of protrusions whose size corresponds to the particle diameter and the like of the inorganic filler can be provided at insulating layer 11 side of plated conductor 21. The anchoring effect thereby can strengthen the adhesion between insulating layer 11 and plated conductor 21 and enhance the connection reliability of through hole 28.

Furthermore, since layer 1 including pores 13 has a low ratio of inorganic filler, the modulus of elasticity is locally reduced. Therefore, a stress relaxation effect with respect to a stress generated by a difference of the thermal expansion coefficients in, for example, a thermal-shock test is achieved, so that the connection reliability of through hole 28 can be enhanced.

As mentioned above, multi-layer printed wiring board 14 includes a laminated body in which one or more insulating layers 11 including at least inorganic filler and resin 17 and one or more layers of wiring pattern 12 are laminated on each other, and through hole 28 having plated conductor 21 for electrically connecting between wiring pattern layers 12. Printed wiring board 14 includes any one or more of a plurality of pores 13 having a diameter of 0.5 times or more and 5.0 times or less as large as the particle diameter of inorganic filler 16, which are formed so as to surround plated conductor 21, and a plurality of protrusions having a size of 0.5 times or more and 5.0 times or less as large as the particle diameter of inorganic filler, which are formed at insulating layer 11 side on the interface of plated conductor 21. Thereby, excellent connection reliability can be secured.

The size of pores 13 or the size of protrusions provided at insulating layer 11 side of plated conductor 21 is desirably 0.5 times or more and 5.0 times or less as large as the particle diameter of inorganic filler 16. When it is less than 0.5 times, a predetermined strength or a stress relaxation function cannot be obtained. When it is more than 5.0 times, thinning of the printed wiring board or fine patterning may be affected.

Sixth Exemplary Embodiment

Next, as a sixth exemplary embodiment, a build-up multi-layer board (which is also referred to as a build-up multi-layer printed wiring board and the like) is described with reference to FIGS. 18 and 19.

Figure 18:
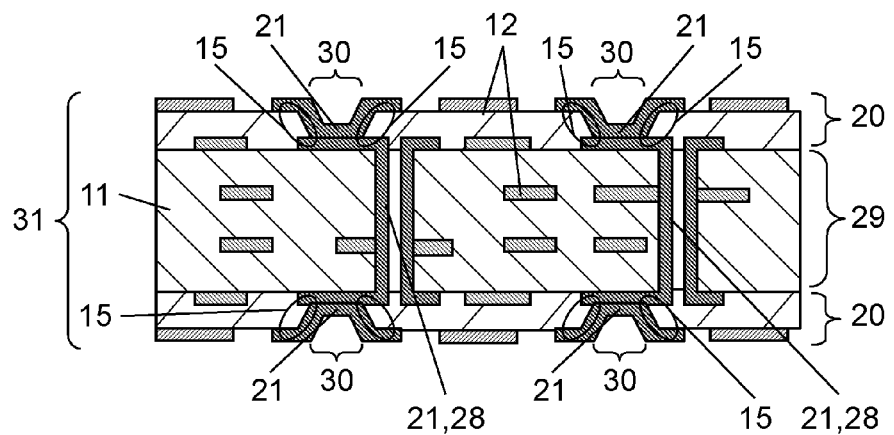
FIG. 18 is a sectional view showing an example of a structure of a build-up multi-layer board in accordance with a sixth exemplary embodiment.

FIG. 18 is a sectional view showing an example of a structure of the build-up multi-layer board in accordance with the sixth exemplary embodiment. Core substrate 29, build-up layer 20, via hole 30, and build-up multi-layer board 31 are shown in FIG. 18.

Build-up multi-layer board 31 shown in FIG. 18 includes an interlayer connection portion (for example, through hole 28 or plated conductor 21 in FIG. 18, but the interlayer connection portion is not necessarily limited to through hole 28, and may be conductive paste and the like) for electrically connecting between the layers of wiring pattern layers 12. The position of resin-filled layer 15 in FIG. 18 is schematically shown in an oval shape.

Furthermore, on the front and rear surfaces of core substrate 29 having wiring pattern layers 12, build-up layer 20 is formed by alternately laminating one or more build-up layers 20 including at least inorganic filler (not shown) and resin (not shown) and one or more layers of wiring pattern layers 12 on each other. When electric connection between a plurality of wiring pattern layers 12 formed in build-up layer 20 portion is carried out by via hole 30 formed by, for example, a plating technique, a wiring pattern layer on the surface layer can be made fine. Furthermore, it is useful that formation of via holes 30 and formation of wiring pattern layer 12 in build-up layer 20 are carried out by plating (including a semi-additive method). Next, details of resin-filled layer 15 and the like are provided in via hole 30 portion are described with reference to FIG. 19.

Figure 19:
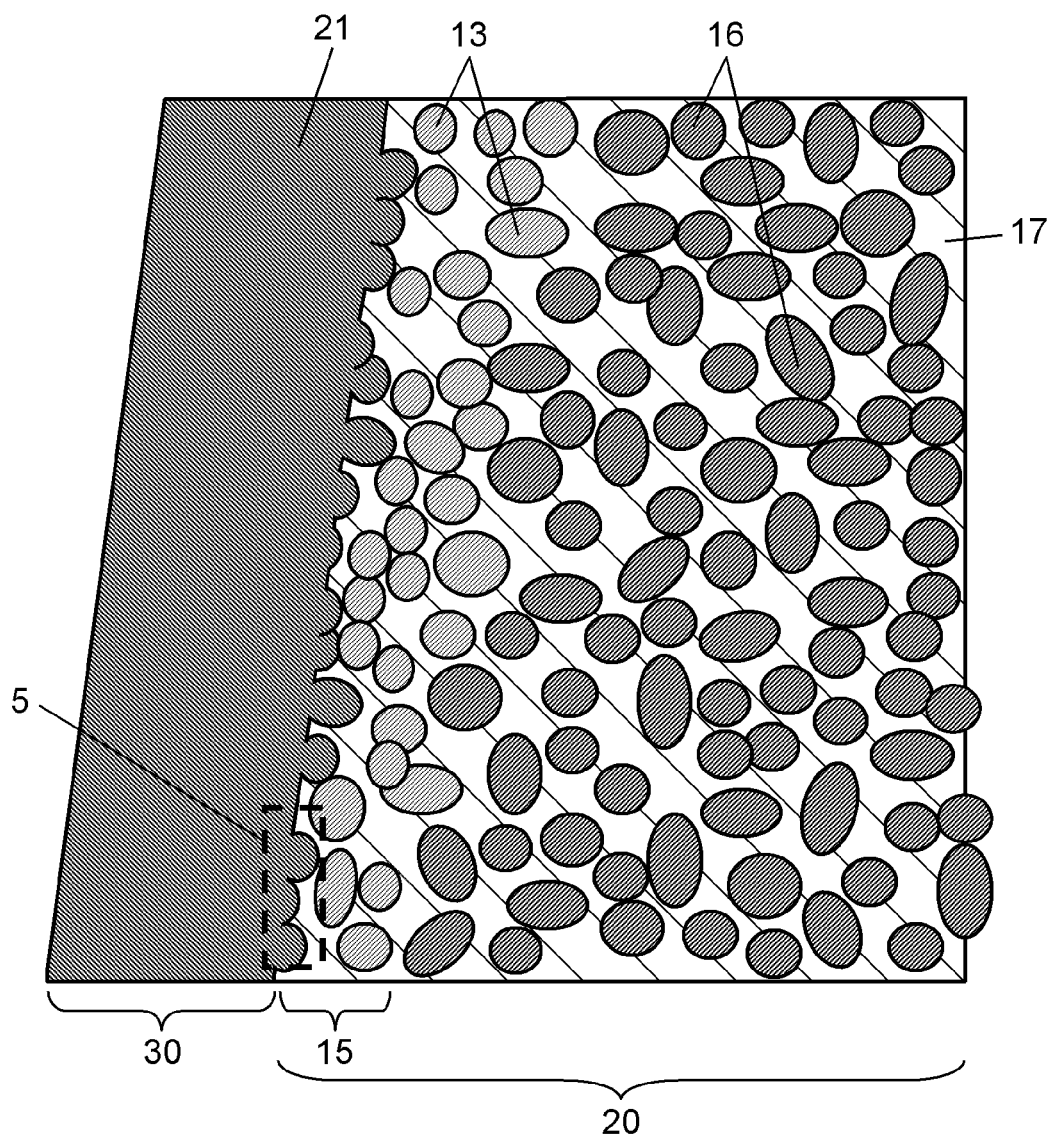
FIG. 19 is an enlarged sectional view of a main part schematically showing a structure of the vicinity of a via hole.

FIG. 19 is an enlarged sectional view of a main part schematically showing a structure of the vicinity of via hole 30. In FIG. 19, via hole 30 and plated conductor 21 are formed obliquely (in a so-called mortar shape, or a taper shape), but the oblique angle and the like may be optimized if necessary.

As shown in FIG. 19, a plurality of pores 13 are provided so as to surround via hole 30 in build-up layer 20 that is brought into contact with (or faces) via hole 30 including plated conductor 21.

In FIG. 19, at build-up layer 20 side with which via hole 30 is brought into contact, protrusions (for example, a portion surrounded by dotted line 5) are also provided.

Furthermore, resin-filled layer 15 having pores 13 is also provided. Resin-filled layer 15 in FIG. 19 includes resin 17 and pores 13. However, instead of pores 13, it is also useful to provide protrusions obtained by forming conductor 21 in at least a part of pores 13. Furthermore, the frequency (or occurrence density) of pores 13 and protrusions in resin-filled layer 15 is substantially the same as the frequency (or occurrence density) of inorganic filler 16 in resin 17 in build-up layer 20.

Note here that since a sectional view of via hole 30 in the plane direction of FIGS. 18 and 19 is common to that of FIG. 17 mentioned above. Therefore, the drawings or the like are omitted herein, but similar to FIG. 17 mentioned above, a plurality of pores 13 are formed so as to surround via hole 30 portion. Furthermore, needless to say, the number of pores 13 is larger near plated conductor 21 and becomes smaller as the distance from plated conductor 21 increases.

In particular, when pores 13 are provided in build-up layer 20, the ratio of inorganic filler 16 is reduced and therefore the modulus of elasticity is locally reduced. Therefore, a stress relaxation effect with respect to a stress generated by a difference of the thermal expansion coefficient in, for example, a thermal-shock test can be achieved, so that the connection reliability of via hole 30 can be enhanced.

Furthermore, it is useful that plated conductor 21 is formed on at least a part of pores 13 formed in build-up layer 20. In this way, a roughened surface (or a plurality of protrusions) is formed on a surface on which build-up layer 20 and plated conductor 21 are adhesively bonded to each other, thereby achieving an effect of strengthening the adhesion between plated conductor 21 and build-up layer 20 by an anchoring effect, and enhancing the connection reliability of via hole 30. This effect can be exhibited regardless of the forms of core substrate 29.

Next, an example of a formation method for pore 13 is described with reference to FIGS. 18 and 19.

Herein, pores 13 can be formed by eluting inorganic filler 16 contained in insulating layer 11 or build-up layer 20 with an acid solution mainly used in the plating process and the patterning process. Therefore, it is desirable that the size of pore 13 is allowed to correspond to the size of inorganic filler 16 contained in insulating layer 11 or build-up layer 20. The size of pore 13 is desirably 0.5 times or more and 5.0 times or less as large as the average particle diameter of inorganic filler 16. Furthermore, the thickness of resin-filled layer 15 including pores 13 can be controlled by changing pH or kinds of solutions of the acid solution to be used in the patterning process or treatment time.

Furthermore, by mixing filler not having solubility with respect to the acid solution, the size of resin-filled layer 15 including pores 13 can be controlled. For example, in FIG. 16 mentioned above, it is useful to allow a member such as glass cloth having low solubility with respect to an acid solution to remain.

Furthermore, a case in which inorganic filler 16 is surface-treated with, for example, a surface treatment agent is described. When through hole 28 and via hole 30 are processed by using a drill or a laser, the surface of inorganic filler 16 is physically cut or denatured, and a new surface that is not surface-treated is exposed. Thereafter, elution proceeds from the exposed new surface with the acid solution used in the plating process and the patterning process. As a result, the amount of pores 13 is not so changed.

According to the experiments by the present inventors, it is optimal that the size of pores 13 in at least a part of which plated conductor 21 is formed is 0.5 to 5.0 times as large as the average particle diameter of inorganic filler 16. Furthermore, when an etching process is used, since pores 13 can be formed by elution of inorganic filler 16, the size of pores 13 is not likely to become less than 0.5 times as large as the particle diameter of inorganic filler 16. Furthermore, by forming insulating layer 11 or build-up layer 20 by uniformly dispersing inorganic filler 16 to primary particles, the size of pores 13 can be suppressed to 5.0 times or less as large as the particle diameter of inorganic fillers 16. The size of pores 13 is more than 5.0 times, for example, the contained inorganic fillers 16 are in a bad dispersion state and aggregated. As a result, pores 13 to be formed are present in an ununiform state, desirable properties such as adhesion with respect to plated conductor 21 or the connection reliability of a stress relaxation layer and the like cannot be achieved.

Seventh Exemplary Embodiment

As a seventh exemplary embodiment, an example of a production method for printed wiring board 14 and build-up multi-layer board 31 is described with reference to FIGS. 20 to 24.

Figure 20A:
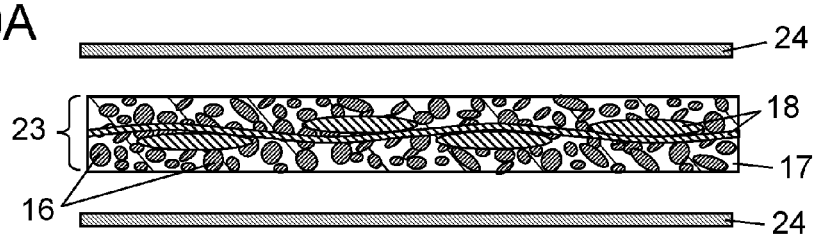
FIG. 20A is a sectional view of a step illustrating an example of a production method for a printed wiring board in accordance with a seventh exemplary embodiment of the present invention.
Figure 20B:
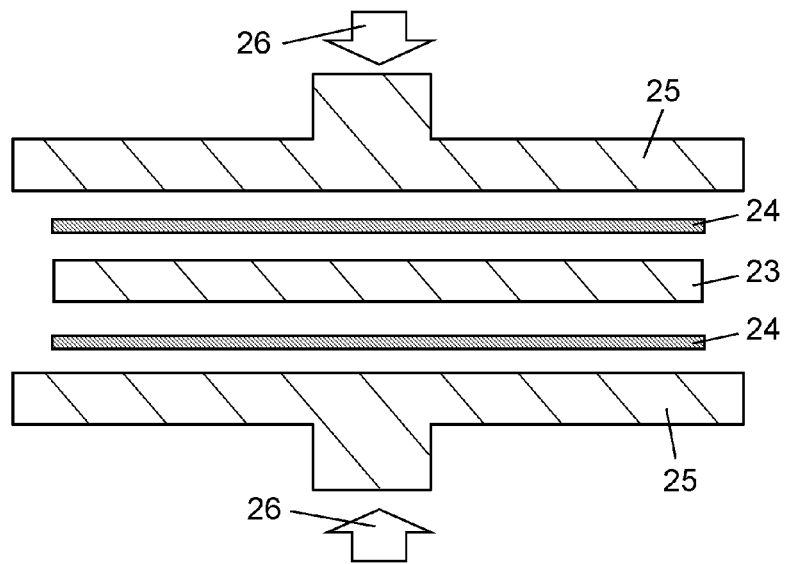
FIG. 20B is a sectional view of a step illustrating an example of the production method for the printed wiring board.
Figure 20C:
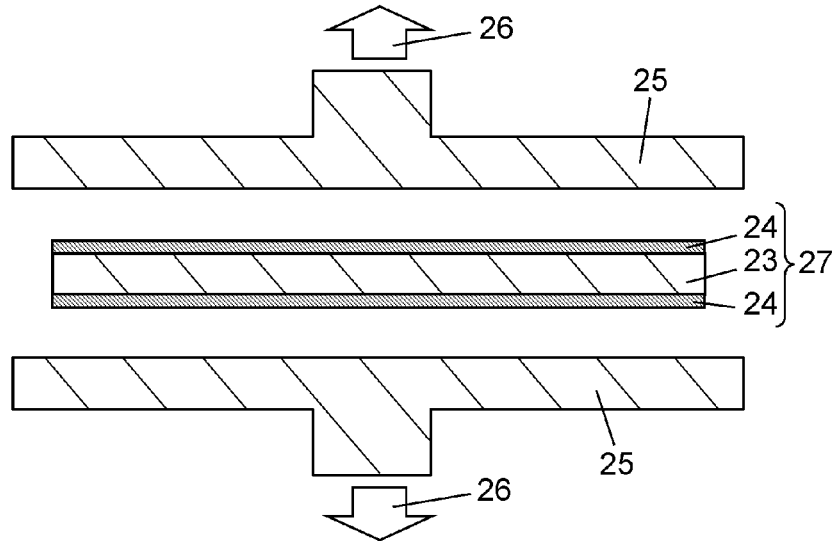
FIG. 20C is a sectional view of a step illustrating an example of the production method for the printed wiring board.

FIGS. 20A to 20C are sectional views of steps illustrating an example of the production method for the printed wiring board. Wiring material 24 such as copper foil, and base material 18 (or a core material) such as a glass fiber and an aramid fiber are shown in FIG. 20. As base material 18, a material having low solubility with respect to acid and the like is used. Prepreg 23 is obtained by impregnating base material 18 with resin 17 in which inorganic filler 16 is dispersed. The drawings include laminated body 27 and arrow 26 showing the pressing direction of press 25.

FIG. 20A is a sectional view illustrating an example of a method for fixing (or integrating) wiring materials 24 on the surface of prepreg 23.

Firstly, as shown in FIG. 20A, wiring materials 24 are placed on the front and rear surfaces of prepreg 23 including at least inorganic filler 16, resin 17, and base material 18. Then, by moving presses 25 in the direction shown by arrows 26, prepreg 23 and wiring material 24 are attached to each other. In FIGS. 20B and 20C, a mold or the like to be set to press 25 is not shown. Then, these members are pressurized to be integrated with each other at a predetermined temperature. Thereafter, as shown in FIG. 20C, by separating presses 25 in the direction of arrows 26, laminated body 27 is obtained. Then, prepreg 23 is hardened, and wiring material 24 is fixed.

Figure 21A:
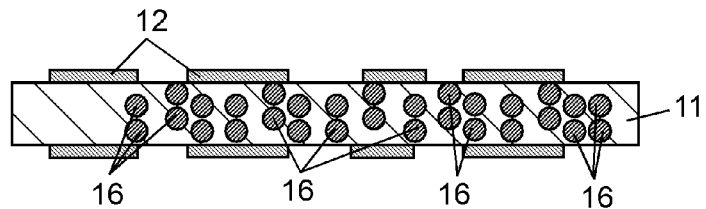
FIG. 21A is a sectional view of a step illustrating a state in which pores are formed.

FIG. 21A to FIG. 21D are sectional views of steps illustrating a state in which pores 13 are formed. The drawings include holes 32. Firstly, as shown in FIG. 21A, wiring materials 24 fixed to the front and rear surfaces of laminated body 27 are patterned into a predetermined shape. Note here that steps of patterning (coating, exposure, and development of photoresist, etching of wiring material 24, removal of the photoresist, and the like) are not shown (omitted).

Figure 21B:
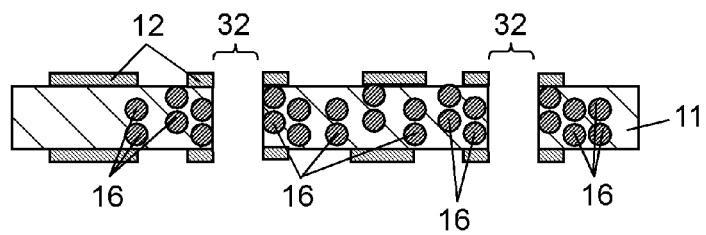
FIG. 21B is a sectional view of a step illustrating the state in which pores are formed.

Next, holes 32 are formed by using a drill or a laser so as to obtain a state shown in FIG. 21B.

Figure 21C:
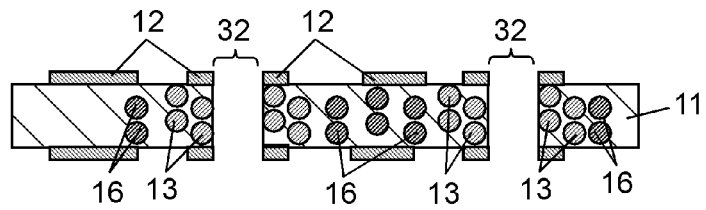
FIG. 21C is a sectional view of a step illustrating the state in which pores are formed.

Next, electroless plating and electrolytic plating are carried out thereto, inorganic filler 16 on the inner wall portion of hole 32 is eluted with acid treatment in the process of electroless plating and electrolytic plating to form pores 13 and the like shown in FIG. 21C.

Figure 21D:
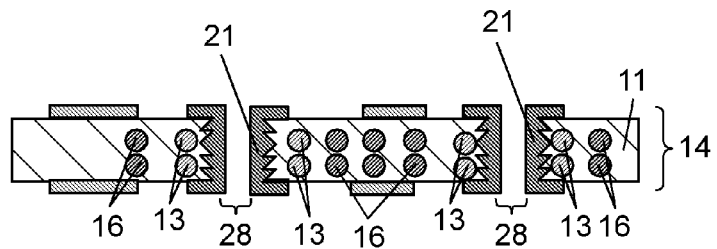
FIG. 21D is a sectional view of a step illustrating the state in which pores are formed.

After that, as shown in FIG. 21D, plated conductor 21 may be precipitated, but plated conductor 21 may be formed concurrently with formation of pores 13. In this way, multi-layer printed wiring board 14 having high connection reliability is obtained.

Next, an example of a production method for a build-up laminated body is described with reference to FIGS. 22 and 23.

Figure 22A:
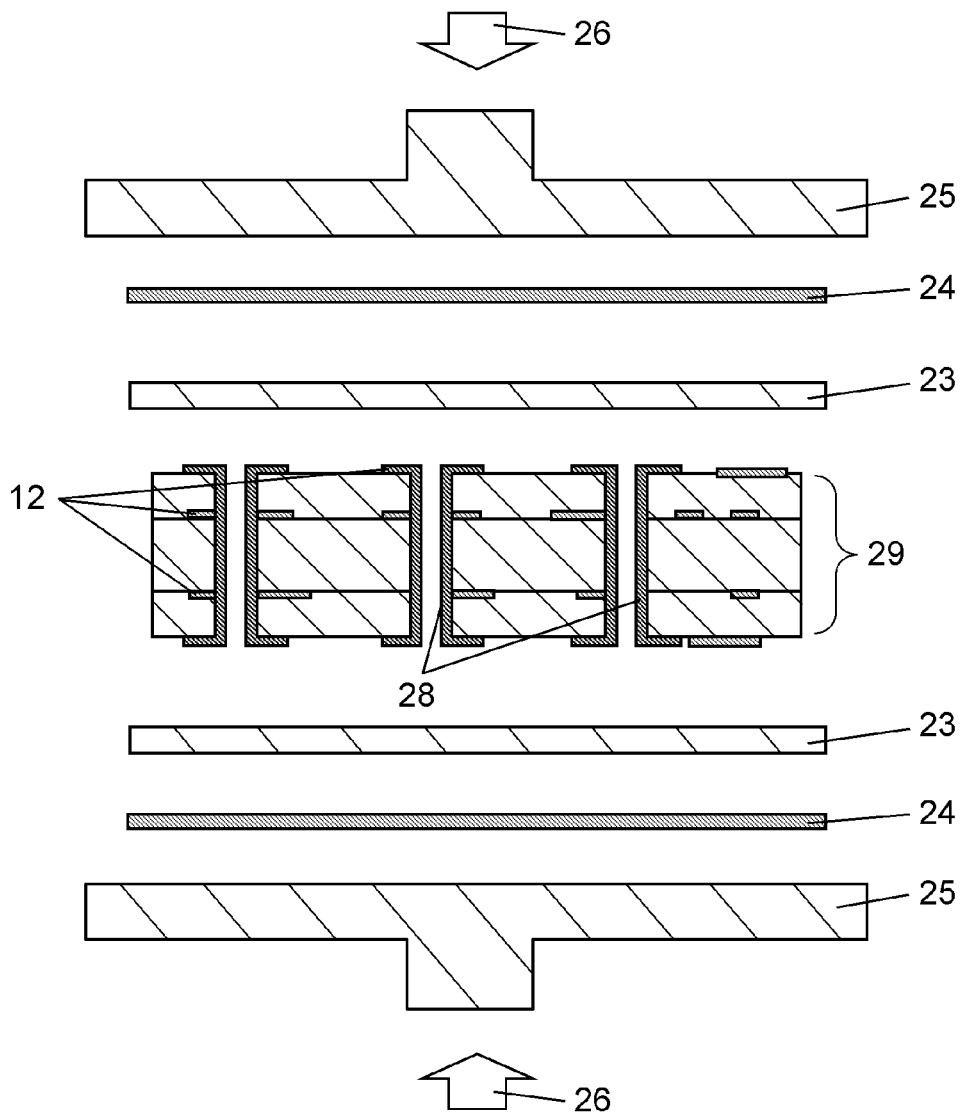
FIG. 22A is a sectional view of a step illustrating a state in which a build-up laminated body is produced.
Figure 22B:
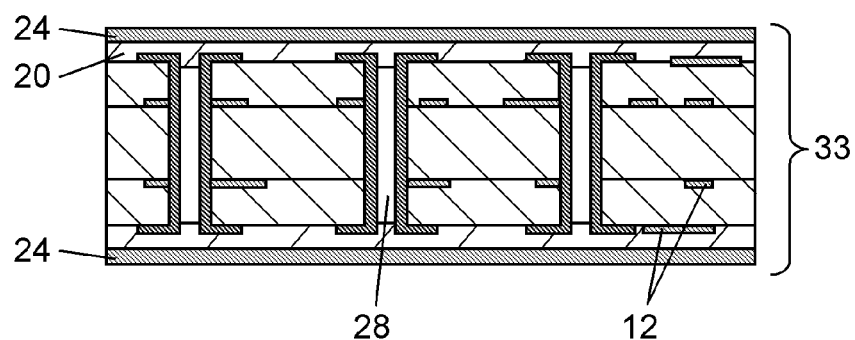
FIG. 22B is a sectional view of a step illustrating the state in which the build-up laminated body is produced.

FIGS. 22A and 22B are sectional views of steps illustrating a state in which the build-up laminated body is produced. The drawings show build-up laminated body 33.

As shown in FIG. 22A, core substrate 29 including an interlayer connection portion including through hole 28 for electrically connecting between the layers of wiring pattern layers 12 and a conductive paste (not shown) is prepared. Then, build-up layers 20 are formed so that they sandwich core substrate 29. Note here that build-up layer 20 includes at least inorganic filler and resin, which are omitted in FIG. 22.

As mentioned above, core substrate 29 including at least an interlayer connection layer such as through hole 28 for electrically connecting between the layers of wiring pattern layers 12 is formed. Then, one or more build-up layers 20 including at least inorganic filler and resin are formed on the front and rear surfaces of core substrate 29. Then, one or more build-up layers 20 and one or more wiring are alternately laminated on each other so as to form a temporary laminated body (not shown, but it is like a product shown in, for example, FIG. 22B).

Thereafter, the temporary laminated body is adhesively bonded to by heating and pressurizing so as to form a laminated body.

For example, the temporary laminated body may be pressurized, heated and integrated by using press 25. By heating and pressurizing during press, resin contained in build-up layer 20 is softened, so that wiring pattern layer 12 on a surface layer of core substrate 29 is embedded (or difference in height by pattern is embedded). Thus, build-up laminated body 33 as shown in FIG. 22B is produced.

Figure 23A:
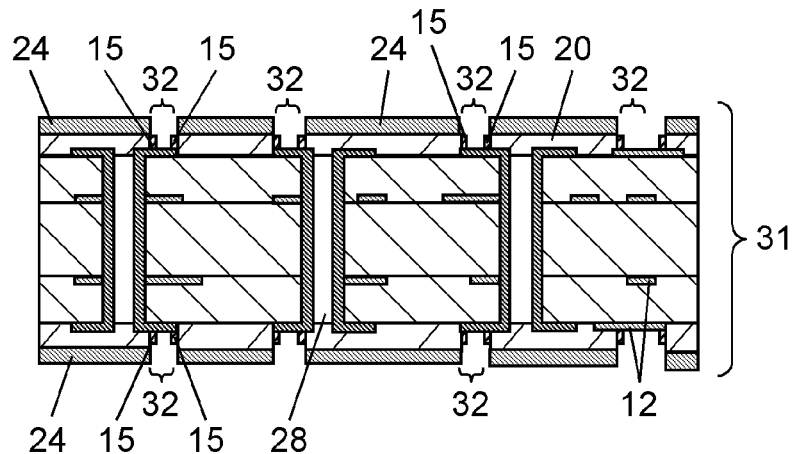
FIG. 23A is a sectional view of a step illustrating a state in which a resin-filled layer is formed in a build-up layer of a build-up multi-layer board.
Figure 23B:
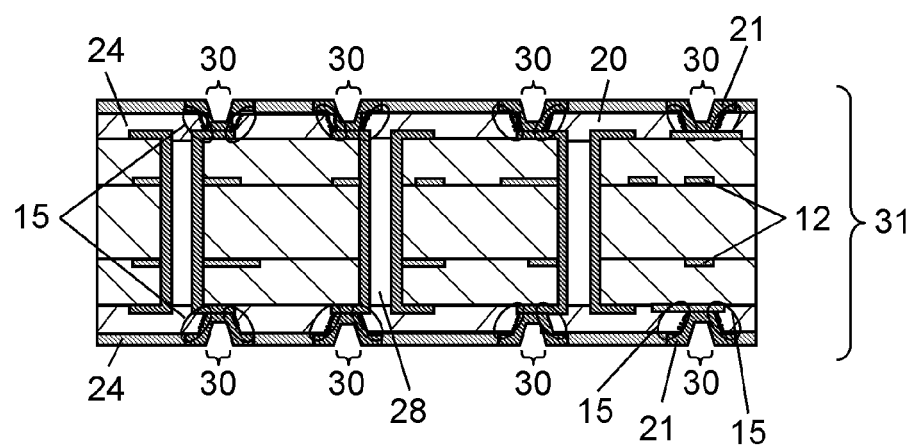
FIG. 23B is a sectional view of a step illustrating the state in which the resin-filled layer is formed in the build-up layer of the build-up multi-layer board.
Figure 23C:
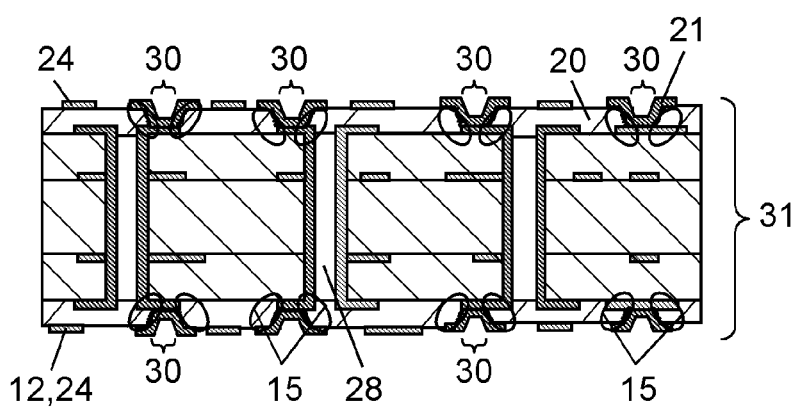
FIG. 23C is a sectional view of a step illustrating the state in which the resin-filled layer is formed in the build-up layer of the build-up multi-layer board.

FIGS. 23A to 23C are sectional views illustrating a state in which resin-filled layer 15 is formed on build-up layer 20 of build-up multi-layer board 31.

Bottomed hole 32 is formed in a predetermined position of build-up multi-layer board 31, and then inorganic filler (not shown) contained in build-up layer 20 exposed to hole 32 is eluted to form resin-filled layer 15 having pores (not shown). Thus, a state of FIG. 23A is obtained. In FIG. 23A, hole 32 is formed by using a drill, a laser, or the like (not shown).

lating layers 11 including at least inorganic filler 16 and resin 17 and one or more layers of wiring pattern layers 12 are alternately laminated on each other, and through hole 28 having plated conductor 21 electrically connecting between the layers of wiring pattern layers 12. A six-layer through hole substrate for evaluation of the connection reliability is produced (Example 3) in which a plurality of pores 13 having a diameter of 0.5 times or more and 5.0 times or less as large as a particle diameter of inorganic filler 16 are formed such that they surround through hole 28. A plurality of types of six-layer through hole substrates which are made of the same resin and which do not include pores are produced in different conditions as Comparative Examples (Comparative Examples 3 and 4). They are subjected to an oil-dip test, and evaluated for variation of resistance values. The results are shown in Table 1. The oil-dip test is carried out in the conditions of 260° C. (15 seconds) to 20° C. (20 seconds). A product having variation of resistance value of 20% or more is determined to be a defect.

TABLE 3

| | Oil dip test, number of cycles | | | | | | | |
|---|---|---|---|---|---|---|---|---|
| | Initial state | 5 | 10 | 15 | 30 | 60 | 100 | 150 |
| Example 3 | 0.00% | −2.50% | −5.00% | 0.00% | −5.00% | 0.00% | 2.50% | 2.00% |
| Example 3 | 0.00% | −2.44% | −2.44% | 0.00% | 0.00% | 0.00% | 2.44% | 2.44% |
| Example 3 | 0.00% | 0.00% | 0.00% | 0.00% | 0.00% | 6.45% | 3.23% | 2.26% |
| Comparative Example 3 | 0.00% | −2.44% | 0.00% | 0.00% | −2.44% | 0.00% | −2.44% | 2.20% |
| Comparative Example 3 | 0.00% | 0.00% | 2.38% | 0.00% | 0.00% | 2.38% | 2.38% | 10.48% |
| Comparative Example 3 | 0.00% | 0.00% | −6.25% | 0.00% | −6.25% | −3.13% | 0.00% | 107.81% |
| Comparative Example 4 | 0.00% | 0.00% | −2.50% | −2.50% | 2.50% | −5.00% | 5.00% | 66.25% |
| Comparative Example 4 | 0.00% | 0.00% | 3.66% | 2.44% | 2.44% | −2.44% | −2.44% | 2.20% |
| Comparative Example 4 | 0.00% | −2.26% | −3.23% | −3.23% | −3.23% | 0.00% | 0.00% | −3.23% |

It is useful that resin-filled layer 15 is formed on the inner wall and the like of hole 32 by acid treatment of the processes of electroless plating or electrolytic plating.

Then, as shown in FIG. 23B, inorganic filler (not shown) on the inner wall portion of hole 32 is eluted to form resin-filled layer 15 including pores (not shown) and simultaneously to precipitate plated conductor 21. Thus, via hole 30 is formed.

Thereafter, as shown in FIG. 23C, wiring material 24 is patterned in a predetermined shape, and thus build-up multi-layer board 31 is obtained.

Note here that as shown in, for example, FIG. 23, it is useful that resin-filled layer 15 is provided in core substrate 29 constituting build-up multi-layer board 31.

Figure 24:
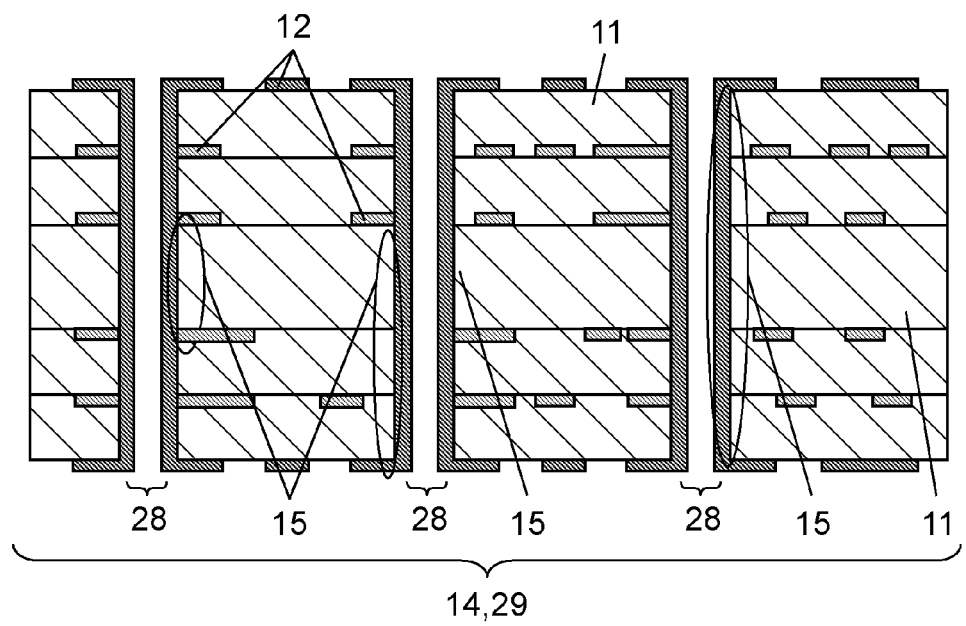
FIG. 24 is a sectional view illustrating a state in which a resin-filled layer is formed in a part of a core substrate.

FIG. 24 is a sectional view illustrating a state in which resin-filled layer 15 is provided in a part of core substrate 29. Printed wiring board 14 shown in FIG. 24 is formed by using, for example, the fifth exemplary embodiment, and this may be used as core substrate 29. As shown in FIG. 24, on the side surface of through hole 28 of printed wiring board 14, resin-filled layer 15 including pores (not shown) is formed.

Next, as the seventh exemplary embodiment, evaluation results of the characteristics of the produced multi-layer printed wiring board are described. In the experiment, printed wiring board 14 as shown in FIG. 14 and the like is produced, which includes a laminated body in which one or more insu- According to the results shown in Table 3, in the test results of Comparative Examples, defects occur in two out of six samples after 100 cycles or later, but in Example 3, no variation in resistance values is found even after 150 cycles or later, showing excellent connection reliability.

As described above, it is revealed that printed wiring board 14 having the following configuration has excellent connection reliability. Printed wiring board 14 includes a laminated body in which one or more insulating layers 11 including at least inorganic filler 16 and resin 17 and one or more layers of wiring pattern layers 12 are alternately laminated on each other, and through hole 28 including plated conductor 21 for electrically connecting between the layers of wiring pattern layers 12, in which pores 13 are provided in insulating layer 11 that is brought into contact with plated conductor 21 such that pores surround through hole 28.

When the same evaluation is carried out also as to build-up to laminated body 31, it is shown that build-up laminated body 31 has the same excellent connection reliability.

Eighth Exemplary Embodiment

An example of a configuration of a prepreg for achieving a printed wiring board of the invention of the present application is described with reference to an eighth exemplary embodiment.

Figure 25:
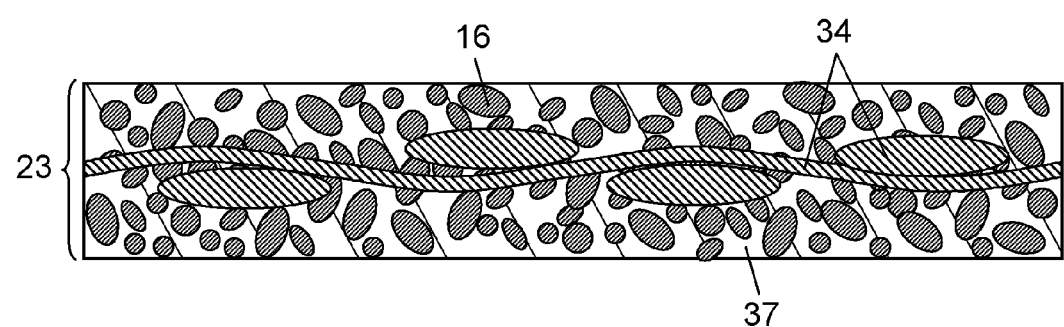
FIG. 25 is a sectional view schematically showing an example of a structure of a prepreg in accordance with an eighth exemplary embodiment of the present invention.

FIG. 25 is a sectional view schematically showing an example of a structure of the prepreg in accordance with the eighth exemplary embodiment of the present invention. Prepreg 23 includes base material 34; inorganic filler 16 in which when 1 g of inorganic filler 16 is immersed in 30 g of at least one of an acid solution of pH5 or less and an alkaline solution of pH10 or more and the solution is stirred for 20 minutes (it is useful that a commercially available glass beaker of about 50 cc to 100 cc is used as a container, and a commercially available magnet stirrer is used for stirring), a temperature of the solution is increased by 5° C. or more (that is to say, the temperature is increased by 5° C. or more from the initial temperature of the experiment or increased by 5° C. or more as compared with room temperature), and a resin composition (not shown) obtained by dispersing resin in organic filler 16. Prepreg 23 is obtained by coating impregnating base material 34 with a varnish obtained by adding an organic solvent into a resin composition, and drying and semi-hardening thereof.

It is desirable that inorganic filler 16 occupies 30 vol. % or more and 70 vol. % or less in resin composition. When the filled amount of inorganic filler 16 is 30 vol. % or less, the amount of pores 13 formed by elution of inorganic filler 16 in the plating process is reduced, and adhesion between plated conductor 21 and insulating layer 11 is lowered in the printed wiring board using a prepreg 23. Therefore, predetermined connection reliability cannot be achieved. When the filled amount of inorganic filler 16 is more than 70 vol. %, the fluidity of the resultant varnish is reduced, so that inconsistency in thickness of the prepreg or cracks due to partial shortage of resin may occur in the formation of a prepreg by coating and impregnation.

Note here that in measurement of a temperature of the solution, it is not necessarily limited to the combination of 1 g of inorganic filler 16 and 30 g of solution. Needless to say, when a combination of 2 g of inorganic filler 16 and 60 g of solution is employed, the same results can be obtained more stably. Furthermore, it is needless to say that evaluation accuracy can be enhanced and experiment time can be shortened by varying the mixing ratio of these members. Furthermore, stirring for 20 minutes may be appropriately adjusted. Needless to say, it is not necessary to wait for 20 minutes, and a temperature of the solution may be increased by 5° C. or more for shorter than 20 minutes.

Furthermore, it is desirable that a temperature of inorganic filler 16 contained in prepreg 23 is increased by 5° C. or more when 1 g of inorganic filler 16 is immersed in 30 g of at least any one of an acid solution of pH5 or less and an alkaline solution of pH10 or more, and the solution is stirred for 20 minutes. When the inorganic filler exhibits solubility with respect to a solution of more than pH5 or less than pH10 (that is to say, a temperature of the solution hardly increases, or a temperature of the solution increase is less than 5° C. during dissolution while stirring for 20 minutes), the inorganic filler is dissolved even in water and the like. Thus, the inorganic filler has high moisture absorption property, production of varnish or handling of inorganic filler 16 itself becomes difficult.

Ninth Exemplary Embodiment

An example of a production method for a prepreg is described with reference to a ninth exemplary embodiment.

Figure 26:
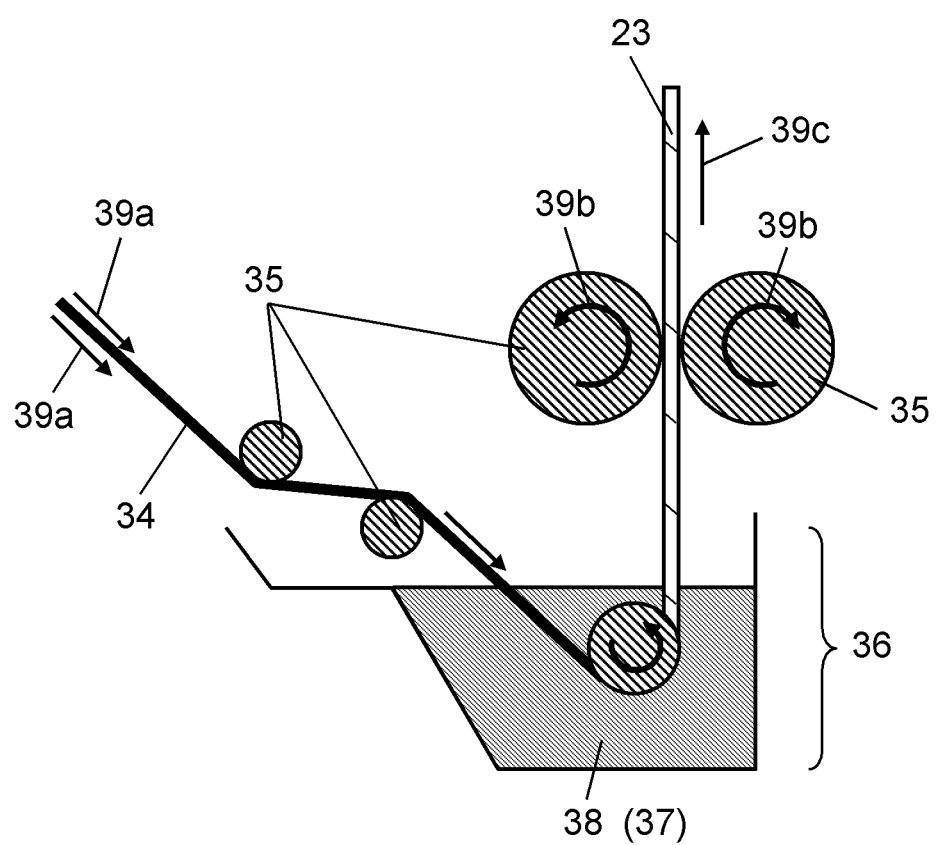
FIG. 26 is a sectional view schematically showing an example of a production method for a prepreg in accordance with a ninth exemplary embodiment of the present invention.

FIG. 26 is a sectional view schematically showing an example of a production method for prepreg 23. In FIG. 26, roller 35 schematically shows a part of equipment for producing a prepreg. Tank 36 includes a member, that is, varnish 38 for forming semi-hardened resin product 37 in a state in which it is dissolved in a predetermined solvent (for example, methyl ethyl ketone, alcohols, and cyclopentanone).

Firstly, as base material 34, 30-micrometer thick glass cloth is prepared herein.

Then, as shown in FIG. 26, base material 34 is placed on rollers 35 and fed in the direction shown by arrow 39a, so that base material 34 is impregnated with varnish 38 contained in tank 36. Then, the impregnation amount of varnish 38 with which base material 34 is impregnated is adjusted while roller 35 is rotated in the direction of arrow 39b. Then, base material 34 is fed in the direction of arrow 39c in a dryer and the like (not shown) so as to remove a solvent component from varnish 38. Furthermore, a resin component contained in varnish 38 is made to be a semi-hardened state (a state before complete hardening, that is, a B-stage state) by, for example, heating to obtain semi-hardened resin product 37. The rate of semi-hardened resin product 37 occupied in prepreg 23 is desirably 40 vol. % or more and 90 vol. % or less with respect to whole prepreg 23.

When the rate is less than 40 vol. %, the ratio of inorganic filler 16 in the prepreg is reduced, the amount of pores by elution of inorganic filler 16 in electroless plating is reduced, so that adhesion between the plated conductor and the insulating layer portion is reduced. As a result, predetermined connection reliability cannot be achieved.

The rate of more than 90 vol. % may affect the flexibility and the handling property of prepreg 23. Thus, prepreg 23 is continuously produced. Note here that a production method for prepreg 23 is not necessarily limited to this method.

Next, varnish 38 placed in tank 36 is described. It is desirable that when prepreg 23 is produced by impregnating base material 34 with varnish 38, the rate of inorganic filler 16 contained in the prepreg is 30 vol. % or more and 70 vol. % or less. The reason therefor is as mentioned above. In order to achieve this, varnish 38 preferably includes at least resin, inorganic filler 16 that disperses in the resin, an amphipathic molecule adsorbed by inorganic filler 16, and an organic solvent in which these materials are allowed to disperse.

The resin includes epoxy resin, and inorganic filler 16 includes at least one material selected from aluminum hydroxide, silicon nitride, tin oxide, zirconium silicate, magnesium oxide, magnesium hydroxide, magnesium carbonate, calcium carbonate, calcium hydroxide, barium carbonate, and barium hydroxide, which are dissolved in a solution of pH5 or more and pH10 or less. Furthermore, inorganic filler 16 includes at least one amphipathic molecules selected from a silane coupling agent, a titanate coupling agent, phosphate ester, carboxylate ester, sulfonate ester, an unsaturated fatty acid, silicone oil, fluorinated ether.

With the affinity between base material 34 and a resin composition taken into consideration, inorganic filler 16 and base material 34 are preferably treated with the same amphipathic molecule. The addition amount of the amphipathic molecule is calculated from the specific surface area of inorganic filler 16, and it is preferably 0.1 wt. % to 5.0 wt. % and preferably 0.1 wt. % or more and 1.0 wt. % or less with respect to inorganic filler 16. When the addition amount is 5.0 wt. % or more, the amphipathic molecule may be absorbed by the inorganic filler more than necessary, and excessive treatment agents cause interaction with resin, which may increase the viscosity of the varnish. Conversely, when the addition amount is less than 0.1 wt. %, the adsorption point of the inorganic filler cannot be covered, and desired properties such as moisture-resistant property and dispersibility cannot be obtained.

Furthermore, as the resin, resin obtained by adding rubber resin and the like to a thermosetting resin mainly such as an epoxy resin can be used.

Firstly, a case in which rubber resin is added is described. Herein, as the rubber resin, NBR (nitrile rubber) and the like can be used.

Other than the nitrile rubber (NBR), as the rubber resin, it is possible to select one or more from hydrogenated nitrile rubber (HNBR), fluorine rubber (FKM, FFKM), acrylic rubber (ACM), silicone rubber (VMQ, FVMQ), urethane rubber (AU, EU), ethylene propylene rubber (EPM, EPDM), chloroprene rubber (CR), chlorosulfonated polyethylene (CSM), epichlorohydrin rubber (CO, ECO), natural rubber (NR), isoprene rubber (IR), styrene-butadiene rubber (SBR), butadiene rubber (BR), norbornene rubber (NOR), thermoplastic elastomer (TPE), and the like.

Furthermore, these rubber resins may be added in a particulate state. When they are added in a particulate state, even if the addition amount is small, a stress relaxation effect can be obtained. This is thought to be because interfaces between the epoxy resin and the rubber resin are increased when resin is added in a particulate state. It is desirable that the particle diameter of the rubber resin is 0.1 micrometers or more and 10 micrometers or less (desirably 1 micrometers or less). A rubber resin having a particle diameter of less than 0.1 micrometers may be special and expensive. Furthermore, when the particle diameter is more than 10 micrometers, thinning of prepreg 23 may be affected.

Next, a case in which a thermoplastic resin is added is described. For example, in varnish 38, an inorganic filling material for enhancing the connection reliability of through hole plating, and a thermoplastic resin, instead of a rubber resin, for enhancing moldability as a printed wiring board can be added to a thermosetting resin mainly such as an epoxy resin. As the thermoplastic resin, a thermoplastic resin having Tg (Tg denotes a glass-transition temperature) of 130° C. or less can be used.

Furthermore, since the upper-limit use temperature of semiconductors is 125° C., temperatures of higher than 125° C. are not required. Therefore, when Tg is made to be 125° C. or less (130° C. or less when variation is considered), a predetermined stress relaxation effect (or ruggedness, shock resistance) can be given to a printed wiring board at the temperature or less. Note here that when long time storage of the printed wiring board (or prepreg 23) is considered, Tg of the thermoplastic resin can be made to be 50° C. or higher.

Similar to the rubber resin, the thermoplastic resin may be also added to an epoxy resin and the like in a particulate state. Thus, the stress relaxation effect can be achieved even when small amount of resin is used. Furthermore, when the rubber resin and the thermoplastic resin are used together, and furthermore, when other particulate resins (for example, core-shell structured particulate, or particulate of acrylate copolymer and PMMA) are added, the same effect can be obtained.

Furthermore, an acrylic resin that is one type of thermoplastic resin can be made to have a particulate shape, and can be added for application of use of the stress relaxation agent. Also in this case, it is desirable that the particle diameter is 0.1 micrometers or more and 10 micrometers or less (desirably, 5 micrometers or less, and further desirably 1 micrometers or less). It may be difficult to disperse resin having a particle diameter of less than 0.1 micrometers in an epoxy resin. Furthermore, the particle diameter of more than 10 micrometers may affect the moldability. Note here that the acrylic resin is a thermoplastic resin. Furthermore, when the thermoplastic resin is added in a particulate state, the addition amount of such resin can be reduced.

This is because interfaces to the epoxy resin as a main component are increased when resin is added in a particulate state. Note here that when a rubber resin or a thermoplastic resin is added into the epoxy resin in a particulate state and hardened, when the cross section is observed by SEM (electron microscope), it is desirable that such particulates cannot be observed (or the interface disappears in a molecular level). This is desirable because when these particulates remain in a particulate state after they are hardened, a stress may be concentrated on the interface thereof.

Next, the ratio of a rubber resin, a thermoplastic resin, or the like, to an epoxy resin is described. The addition amount of any one of the rubber resin and the thermoplastic resin with respect to all resin is desirably in the range of 1 wt. % or more and 10 wt. % or less. When the addition amount of any one of the rubber resin and the thermoplastic resin with respect to all resin is less than 1 wt. %, an effect by addition may not be able to be obtained. Furthermore, when the addition amount of any one of the rubber resin and the thermoplastic resin is more than 10 wt. %, the rate of the epoxy resin is lowered, and therefore the thermal conductivity of the resultant printed wiring board may be affected.

Note here that when such members are added as particulates, the addition amount can be reduced. In this case, the increase or decrease of any one of the rubber resin and the thermoplastic resin can be 0.5 wt. % or more. When it is less than 0.5 wt. %, even when the resin is added as particulates, the effect thereof may not be able to be obtained. Note here that a combination of the rubber resin and the thermoplastic resin can be used.

Furthermore, it is desirable that an average particle diameter of inorganic filler 16 is in the range of 0.01 μm or more and 20.00 μm or less, and further preferably 0.1 μm or more and 5.0 μm or less. The average particle diameter of 0.01 μm or less makes the specific surface area large and makes dispersion thereof into varnish 38 difficult. Furthermore, the average particle diameter of more than 20.00 μm makes the thinning of the prepreg difficult.

In order to enhance the filling rate of inorganic filler 16, or to control the size or the ratio of the produced pores 13, a plurality of types of inorganic filler 16 having different particle size distribution is selected and they may be mixed and used.

Table 4 shows changes over time of a temperature of the solution for 20 minutes when 1 g of the inorganic filler is immersed in 30 g of 2N sulfuric acid. Increased values from the initial temperatures are shown in parentheses. For accurately measuring the change in the solution temperature, it is useful to use a predetermined heat reserving device (or a heat insulating device).

TABLE 4

| | Change over time of solution temperature (° C.) | | | | | | |
|---|---|---|---|---|---|---|---|
| Inorganic filler | 0 min | 1 min | 2 min | 5 min | 10 min | 15 min | 20 min |
| Example 4 (magnesium oxide) | 25 | 27 | 35 | 49 | 45 | 40 | 35 |
| Comparative Example 5 (silica) | 25 | 25 | 25 | 25 | 25 | 25 | 25 |

From the results shown in Table 4, it is confirmed that when 1 g of magnesium oxide of Example 4 is immersed in 30 g of 2N sulfuric acid, and the solution is continued to be stirred, magnesium oxide gradually dissolves and the solution temperature is increased. In magnesium oxide of Example 4, the heat generation of maximum 24° C. for 20 minutes is finally shown. When the same evaluation is carried out by using silica of Comparative Example 5, silica hardly dissolves in 2N sulfuric acid and the increase in the solution temperature for 20 minutes is not observed.

INDUSTRIAL APPLICABILITY

As mentioned above, according to a multi-layer printed wiring board and a production method therefor of the present invention, a multi-layer printed wiring board which is excellent in copper foil peel strength and which is excellent in connection reliability in which the occurrence of delamination (interlayer peeling) between the insulating layers and in an interface portion between insulating layer and a plated conductor is prevented, and a production method therefor can be achieved.

The multi-layer printed wiring board and the production method therefor of the present invention are suitable for a multi-layer printed wiring board used when various electronic components such as a semiconductor having improved functions are densely packaged, and effective for a variety of small devices such as portable telephones, personal computer, digital cameras, and the like.

REFERENCE MARKS IN DRAWINGS 11, 11a, 11b, 11c insulating layer
12 wiring pattern
13, 13a, 13b pores
14 printed wiring board
15 resin-filled layer
16, 16a, 16b inorganic filler
17, 17a, 17b resin
18 glass woven fabric and/or nonwoven fabric
19 resist
20 build-up layer
21 plated conductor
22 build-up resin
23 prepreg
24 copper foil
25 press
26 arrow
27 laminated body
28 through hole
29 core substrate
30 via hole
31 build-up multi-layer board
32 hole
34 base material
35 roller
36 tank
37 semi-hardened resin product
38 varnish
39 arrow

The invention claimed is:

1. A printed wiring board comprising:
a first insulating layer;
a second insulating layer;
wiring patterns made of copper foil, which are alternately laminated on the first and the second insulating layers; and
a resin-filled layer provided only at a side of the first insulating layer between the wiring patterns,
wherein the first and second insulating layers include at least resin, glass woven fabric and/or nonwoven fabric, and inorganic filler whose content is 30 vol. % or more and 70 vol. % or less with respect to the insulating layer,
the inorganic filler has solubility with respect to an acid solution of more than pH5 or alkaline solution of less than pH10,
the inorganic filler includes at least one material selected from aluminum hydroxide, silicon nitride, tin oxide, zirconium silicate, magnesium hydroxide, magnesium carbonate, calcium carbonate, calcium hydroxide, barium carbonate, and barium hydroxide, and
the resin-filled layer includes a plurality of pores formed at the side of the first insulating layer and a resin product formed by filling the pores with resin of the second resin layer.

2. The printed wiring board of claim 1, wherein the pores are formed by dissolving the inorganic filler.

3. The printed wiring board of claim 1, wherein a diameter of the pore is 0.5 times or more and 5.0 times or less as large as a diameter of the inorganic filler.

4. The printed wiring board of claim 1, wherein the inorganic filler has solubility such that when 1 g of the inorganic filler is immersed in 30 g of any one of an acid solution of pH5 or less and an alkaline solution of pH10 or more and the solution is stirred for 20 minutes, a temperature of the solution increases by 5° C. or more.

5. The printed wiring board of claim 4, wherein the acid solution is an aqueous solution containing at least one material selected from hydrochloric acid, sulfuric acid, nitric acid, and hydrogen peroxide.

6. The printed wiring board of claim 4, wherein the alkaline solution is an aqueous solution containing at least one material selected from alkaline metal hydroxide and alkaline earth metal hydroxide.

7. The printed wiring board of claim 1, wherein the inorganic filler comprises, on at least a surface thereof, an amphipathic molecule including at least one material selected from a silane coupling agent, a titanate coupling agent, phosphate ester, carboxylate ester, sulfonate ester, an unsaturated fatty acid, silicone oil, and fluorinated ether.

8. A printed wiring board comprising:
a plurality of insulating layers;
a plurality of layers of wiring patterns made of copper foil, which are alternately laminated on the insulating layers; and
a resist-filled layer provided only at a side of an outermost layer of the insulating layers between the wiring patterns,
wherein each of the insulating layers includes at least resin, glass woven fabric and/or nonwoven fabric, inorganic filler whose content is 30 vol. % or more and 70 vol. % or less with respect to the insulating layer,
the inorganic filler has solubility with respect to an acid solution of more than pH5 or alkaline solution of less than pH10,
the inorganic filler includes at least one material selected from aluminum hydroxide, silicon nitride, tin oxide, zirconium silicate, magnesium hydroxide, magnesium carbonate, calcium carbonate, calcium hydroxide, barium carbonate, and barium hydroxide, and
the resist-filled layer includes a plurality of pores formed on the outermost layer, and a resist-filled product formed by filling the pores with resist.

9. The printed wiring board of claim 8, wherein the pores are formed by dissolving the inorganic filler.

10. The printed wiring board of claim 8, wherein a diameter of the pore is 0.5 times or more and 5.0 times or less as large as a diameter of the inorganic filler.

11. The printed wiring board of claim 8, wherein the inorganic filler has solubility such that when 1 g of the inorganic filler is immersed in 30 g of any one of an acid solution of pH5 or less and an alkaline solution of pH10 or more and the solution is stirred for 20 minutes, a temperature of the solution increases by 5° C. or more.

12. The printed wiring board of claim 11, wherein the acid solution is an aqueous solution including at least one material selected from hydrochloric acid, sulfuric acid, nitric acid, and hydrogen peroxide.

13. The printed wiring board of claim 11, wherein the alkaline solution is an aqueous solution containing at least one material selected from alkaline metal hydroxide and alkaline earth metal hydroxide.

14. The printed wiring board of claim 8, wherein the inorganic filler comprises, on at least a surface thereof, an amphipathic molecule including at least one material selected from a silane coupling agent, a titanate coupling agent, phosphate ester, carboxylate ester, sulfonate ester, an unsaturated fatty acid, silicone oil, and fluorinated ether.

15. A production method for a printed wiring board, the method comprising:
laminating a first copper foil on at least one surface of a prepreg including at least a semi-hardened first resin, glass woven fabric and/or nonwoven fabric, and inorganic filler, and thermally hardening the resin, for forming a first laminated body having copper foil;
patterning the first copper foil on a surface layer of the first laminated body to form wiring patterns, and, simultaneously forming a plurality of pores on a surface of the first laminated body exposed between the wiring patterns, for forming a first laminated body having pores;
laminating a second prepreg including a second copper foil, a semi-hardened second resin, glass woven fabric and/or nonwoven fabric, and inorganic filler, and the first laminated body having pores on each other, and thermally hardening the second resin in a state in which at least a part of the pores is filled with a part of the second resin in the second prepreg to form a resin-filled layer, for forming a second laminated body; and
patterning the second copper foil on a surface layer of the second laminated body, for forming an outer layer wiring pattern,
wherein the printed wiring board includes:
a first insulating layer;
a second insulating layer;
wiring patterns made of copper foil, which are alternately laminated on the first and the second insulating layers; and
a resin-filled layer provided only at a side of the first insulating layer between the wiring patterns,
wherein the first and the second insulating layers include at least resin, glass woven fabric and/or nonwoven fabric, inorganic filler whose content is 30 vol. % or more and 70 vol. % or less with respect to the insulating layer, and
the resin-filled layer includes a plurality of pores formed at the side of the first insulating layer and a resin product formed by filling the pores with resin of the second resin layer.

16. A production method for a printed wiring board, the method comprising:
patterning copper foil on a surface layer to form a surface layer wiring pattern and simultaneously forming a plurality of pores on a surface of an insulating layer exposed between the surface layer wiring patterns; and
filling at least a part of the plurality of pores with resist to form a resist-filled layer,
wherein the printed wiring board includes:
a plurality of insulating layers;
a plurality of layers of wiring patterns made of copper foil, which are alternately laminated on the insulating layers; and
a resist-filled layer provided only at a side of an outermost layer of the insulating layers between the wiring patterns,
wherein the insulating layer includes at least resin, glass woven fabric and/or nonwoven fabric, inorganic filler whose content is 30 vol. % or more and 70 vol. % or less with respect to the insulating layer, and
the resist-filled layer includes a plurality of pores formed on the insulating layer on the outermost layer, and
a resist-filled product formed by filling the pores with resist.

* * * * *